US009905568B2

(12) United States Patent
Son et al.

(10) Patent No.: US 9,905,568 B2
(45) Date of Patent: Feb. 27, 2018

(54) NONVOLATILE MEMORY DEVICE AND A METHOD FOR FABRICATING THE SAME

(71) Applicant: SAMSUNG ELECTRONICS CO., LTD., Suwon-si, Gyeonggi-do (KR)

(72) Inventors: Yong-Hoon Son, Yongin-si (KR); Jong-Won Kim, Hwaseong-si (KR); Chang-Seok Kang, Seongnam-si (KR); Young-Woo Park, Seoul (KR); Jae-Duk Lee, Seongnam-si (KR); Kyung-Hyun Kim, Seoul (KR); Byeong-Ju Kim, Hwaseong-si (KR); Phil-Ouk Nam, Suwon-si (KR); Kwang-Chul Park, Suwon-si (KR); Yeon-Sil Sohn, Yongin-si (KR); Jin-I Lee, Hwaseong-si (KR); Won-Bong Jung, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/251,580

(22) Filed: Aug. 30, 2016

(65) Prior Publication Data

US 2017/0069637 A1    Mar. 9, 2017

(30) Foreign Application Priority Data

Sep. 8, 2015    (KR) .................. 10-2015-0126836

(51) Int. Cl.
*H01L 27/115*        (2017.01)
*H01L 29/66*        (2006.01)
(Continued)

(52) U.S. Cl.
CPC .... *H01L 27/1157* (2013.01); *H01L 27/11565* (2013.01); *H01L 27/11582* (2013.01); *H01L 29/66833* (2013.01)

(58) Field of Classification Search
CPC ........... H01L 27/11582; H01L 29/4234; H01L 29/523; H01L 29/66833; H01L 27/1157; H01L 27/11565
See application file for complete search history.

(56) References Cited

U.S. PATENT DOCUMENTS 8,445,347 B2    5/2013    Alsmeier
8,455,940 B2 *    6/2013    Lee .................. H01L 27/11565
257/288
(Continued)

*Primary Examiner* — Latanya N Crawford
(74) *Attorney, Agent, or Firm* — F. Chau & Associates, LLC

(57) ABSTRACT

A nonvolatile memory device includes a conductive line disposed on a substrate and vertically extended from the substrate, a first channel layer disposed on the substrate and vertically extended from the substrate, wherein the first channel layer is spaced apart from the conductive line, a second channel layer vertically extended from the substrate, wherein the second channel layer is disposed between the first channel layer and the conductive line, a first gate electrode disposed between the conductive line and the second channel layer, wherein the first gate electrode includes a first portion having a first thickness and a second portion having a second thickness that is different from the first thickness, and a second gate electrode disposed between the first channel layer and the second channel layer, wherein the second gate electrode has the second thickness.

20 Claims, 27 Drawing Sheets

(51) Int. Cl.
*H01L 27/1157* (2017.01)
*H01L 27/11565* (2017.01)
*H01L 27/11582* (2017.01)

(56) References Cited

U.S. PATENT DOCUMENTS

| | | | |
|---|---|---|---|
| 8,501,609 B2 | 8/2013 | Roizin et al. | |
| 8,599,616 B2 | 12/2013 | Roizin et al. | |
| 8,643,084 B2 | 2/2014 | Shin et al. | |
| 8,877,626 B2 * | 11/2014 | Lee | H01L 27/11565 257/288 |
| 8,912,591 B2 * | 12/2014 | Baek | H01L 27/11568 257/324 |
| 8,928,063 B2 * | 1/2015 | Kim | H01L 29/792 257/324 |
| 8,933,501 B2 | 1/2015 | Makala et al. | |
| 9,356,031 B2 * | 5/2016 | Lee | H01L 27/11521 |
| 2012/0012920 A1 * | 1/2012 | Shin | H01L 27/11578 257/324 |
| 2013/0134493 A1 * | 5/2013 | Eom | H01L 29/7926 257/314 |
| 2013/0161726 A1 * | 6/2013 | Kim | H01L 29/792 257/324 |
| 2013/0248974 A1 * | 9/2013 | Alsmeier | G11C 16/04 257/321 |
| 2013/0341701 A1 | 12/2013 | Blomme et al. | |
| 2014/0353738 A1 | 12/2014 | Makala et al. | |
| 2015/0008505 A1 | 1/2015 | Chien et al. | |
| 2015/0011062 A1 | 1/2015 | Khoueir et al. | |
| 2015/0069494 A1 | 3/2015 | Makala et al. | |
| 2015/0118811 A1 | 4/2015 | Makala et al. | |
| 2015/0243675 A1 * | 8/2015 | Lim | H01L 27/11556 257/324 |
| 2016/0043093 A1 * | 2/2016 | Lee | H01L 27/11521 257/314 |

* cited by examiner ued States Patent US 9,905,568 B2

NONVOLATILE MEMORY DEVICE AND A METHOD FOR FABRICATING THE SAME

CROSS-REFERENCE TO RELATED APPLICATION

This application claims priority under 35 U.S.C. § 119 to Korean Patent Application No. 10-2015-0126836, filed on Sep. 8, 2015 in the Korean Intellectual Property Office, the disclosure of which is incorporated by reference herein in its entirety.

1. Technical Field

The present inventive concept relates to a nonvolatile memory device and a method for fabricating the same.

2. Description of the Related Art

A semiconductor memory device is a storage device that is implemented using a semiconductor such as silicon (Si), germanium (Ge), gallium arsenide (GaAs), or indium phosphide (InP). The semiconductor memory device is classified as a volatile memory device or a nonvolatile memory device.

The volatile memory device is a memory device in which stored data is lost when its power supply is interrupted. The volatile memory device includes a Static Random Access Memory (SRAM), a Dynamic RAM (DRAM), a Synchronous DRAM (SDRAM), and the like. The nonvolatile memory device is a memory device in which stored data is maintained even when its power supply is interrupted. The nonvolatile memory device includes a flash memory device, a Read Only Memory (ROM), a Programmable ROM (PROM), an Electrically Programmable ROM (EPROM), an Electrically Erasable and Programmable ROM (EEPROM), and a resistive memory (e.g., a Phase-change RAM (PRAM), a Ferroelectric RAM (FRAM), and a Resistive RAM (RRAM)).

To increase performance and decrease price, the degree of integration of the nonvolatile memory device has been increasing. In the case of a two-dimensional (2D) or flat (e.g., planar type) memory device, the integration degree depends on an area occupied by a unit memory cell. Accordingly, a three-dimensional (3D) memory device in which unit memory cells are vertically disposed has been developed to increase the degree of integration over that of the 2D type memory device.

SUMMARY

According to an exemplary embodiment of the present inventive concept, there is provided a nonvolatile memory device comprising a conductive line disposed on a substrate and vertically extended from the substrate, a first channel layer disposed on the substrate and vertically extended from the substrate, wherein the first channel layer is spaced apart from the conductive line, a second channel layer vertically extended from the substrate, wherein the second channel layer is disposed between the first channel layer and the conductive line, a first gate electrode disposed between the conductive line and the second channel layer, wherein the first gate electrode includes a first portion having a first thickness and a second portion having a second thickness that is different from the first thickness and a second gate electrode disposed between the first channel layer and the second channel layer, wherein the second gate electrode has the second thickness.

In an exemplary embodiment of the present inventive concept, the nonvolatile memory device comprises a three-dimensional (3D) memory array.

In an exemplary embodiment of the present inventive concept, the 3D memory array comprises a plurality of memory cells, and each of the plurality of memory cells comprises a charge trap layer.

In an exemplary embodiment of the present inventive concept, the 3D memory array comprises a plurality of memory strings that are vertically arranged with respect to the substrate.

In an exemplary embodiment of the present inventive concept, the first portion of the first gate electrode is closer to the conductive line than the second portion of the first gate electrode.

In an exemplary embodiment of the present inventive concept, the first thickness is larger than the second thickness.

In an exemplary embodiment of the present inventive concept, the nonvolatile memory device may further comprise a third gate electrode disposed between the conductive line and the second channel layer, a first air gap disposed between the third gate electrode and the first gate electrode, a fourth gate electrode disposed between the first channel layer and the second channel layer and a second air gap disposed between the fourth gate electrode and the second gate electrode.

In an exemplary embodiment of the present inventive concept, the third gate electrode comprises a third portion that corresponds to the first portion of the first gate electrode and a fourth portion that corresponds to the second portion of the first gate electrode, and the first air gap is disposed between the second portion of the first gate electrode and the fourth portion of the third gate electrode.

According to an exemplary embodiment of the present inventive concept, there is provided a method for fabricating a nonvolatile memory device, comprising forming a mold layer on a substrate, wherein the mold layer comprises first and second sacrificial layers that are alternately laminated, forming a channel hole in the mold layer to expose the substrate in the mold layer, forming an etch stop pattern on the first sacrificial layer that is exposed by the channel hole, forming a channel layer in the channel hole in which the etch stop pattern is formed, forming a trench in the mold layer, wherein the trench is spaced apart from the channel layer and exposes the substrate, forming a first extension portion by removing the first sacrificial layer and the etch stop pattern after forming the trench and forming an interlayer insulating layer that includes an air gap in the first extension portion.

In an exemplary embodiment of the present inventive concept, the forming of the etch stop pattern comprises forming a first recess by removing a part of the first sacrificial layer that is exposed by the channel hole, forming an etch stop layer which fills the first recess along a side wall of the channel hole and removing the etch stop layer that is formed on the second sacrificial layer.

In an exemplary embodiment of the present inventive concept, the method for fabricating a nonvolatile memory device may further comprise, after forming the trench and before forming the first extension portion, forming a second recess by removing a part of the second sacrificial layer that is exposed by the trench and forming a third recess by increasing a width of the second recess.

In an exemplary embodiment of the present inventive concept, the method for fabricating a nonvolatile memory device may further comprise, forming a second extension portion by removing the remaining second sacrificial layer after forming the third recess and forming a gate electrode that fills the second extension portion.

In an exemplary embodiment of the present inventive concept, the gate electrode comprises a first portion and a second portion, the first portion of the gate electrode comprises an exposure surface that is exposed by the trench, and the second portion of the gate electrode is disposed between the first portion of the gate electrode and the channel layer, and a thickness of the first portion of the gate electrode is larger than a thickness of the second portion of the gate electrode.

In an exemplary embodiment of the present inventive concept, the air gap is formed between the gate electrode and another gate electrode that are vertically adjacent to each other.

In an exemplary embodiment of the present inventive concept, the method for fabricating a nonvolatile memory device may further comprise, forming a capping pattern that fills the third recess after forming the third recess, and wherein the capping pattern and the second sacrificial layer comprise the same material.

According to an exemplary embodiment of the present inventive concept, there is provided a nonvolatile memory device comprising: a conductive line extended from a substrate in a first direction; a first channel layer extended from the substrate in the first direction; a second channel layer extended from the substrate in the first direction, wherein the second channel layer is disposed between the first channel layer and the conductive line; a first gate electrode disposed between the conductive line and the second channel layer; and a second gate electrode disposed between the first channel layer and the second channel layer, wherein the second gate electrode has a different shape than the first gate electrode.

In an exemplary embodiment of the present inventive concept, the first gate electrode includes a first portion adjacent to the conductive line and a second portion adjacent to the second channel layer, wherein a width of the first portion is greater than a width of the second portion.

In an exemplary embodiment of the present inventive concept, a width of the second gate electrode is the same as the width of the second portion of the first gate electrode.

In an exemplary embodiment of the present inventive concept, the nonvolatile memory device further comprises: a third gate electrode extended from the substrate in the first direction; and a first air gap disposed between the first gate electrode and the third gate electrode.

In an exemplary embodiment of the present inventive concept, the third gate electrode has the same shape as the first gate electrode.

BRIEF DESCRIPTION OF THE DRAWINGS

The above and other features of the present inventive concept will become more apparent by describing in detail exemplary embodiments thereof in conjunction with the accompanying drawings, in which.

DETAILED DESCRIPTION OF THE EMBODIMENTS

Exemplary embodiments of the present inventive concept will now be described more fully hereinafter with reference to the accompanying drawings. This inventive concept may, however, be embodied in different forms and should not be construed as limited to the embodiments set forth herein. The same reference numbers may indicate the same components throughout the specification. In the attached figures, the thickness of layers and regions may be exaggerated for clarity.

It will be understood that when an element or layer is referred to as being "connected to," or "coupled to" another element or layer, it can be directly connected to or coupled to another element or layer or intervening elements or layers may be present.

It will also be understood that when a layer is referred to as being "on" another layer or substrate, it can be directly on the other layer or substrate, or intervening layers may also be present.

The use of the terms "a" and "an" and "the" and similar referents in the context of describing the inventive concept are to be construed to cover both the singular and the plural, unless otherwise indicated herein or clearly contradicted by context.

In an exemplary embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells. The associated circuitry may be disposed above or within the substrate. The term "monolithic" may mean that layers of each level of the array are directly deposited on the layers of each underlying level of the array In an exemplary embodiment of the present inventive concept, the 3D memory array includes vertical NAND strings that are vertically oriented such that at least one memory cell is located over another memory cell. The at least one memory cell may comprise a charge trap layer. The following patent documents, which are hereby incorporated by reference in their entireties, describe configurations of three-dimensional memory arrays, in which the three-dimensional memory array is configured as a plurality of levels, with word lines and/or bit lines shared between the levels: U.S. Pat. Nos. 7,679,133; 8,553,466; 8,654,587; 8,559,235; and U.S. Pat. Pub. No. 2011/0233648.

Hereinafter, a nonvolatile memory device according to an exemplary embodiment of the present inventive concept will be described with reference to FIGS. 1 to 3.

Figure 1:
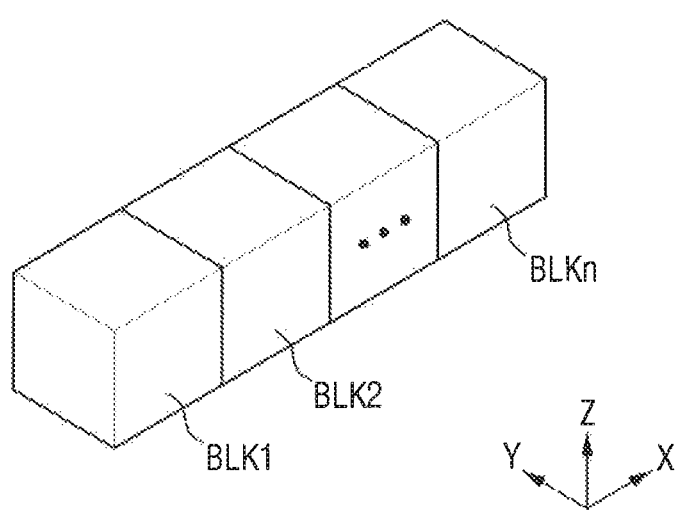
FIG. 1 is a view of a nonvolatile memory device according to an exemplary embodiment of the present inventive concept.

FIG. 1 is a view of a nonvolatile memory device according to an exemplary embodiment of the present inventive concept. FIG. 2 is a perspective view of a memory block of FIG. 1 according to an exemplary embodiment of the present inventive concept, and FIG. 3 is a cross-sectional view taken along line A-A' of FIG. 2 according to an exemplary embodiment of the present inventive concept.

Figure 2:
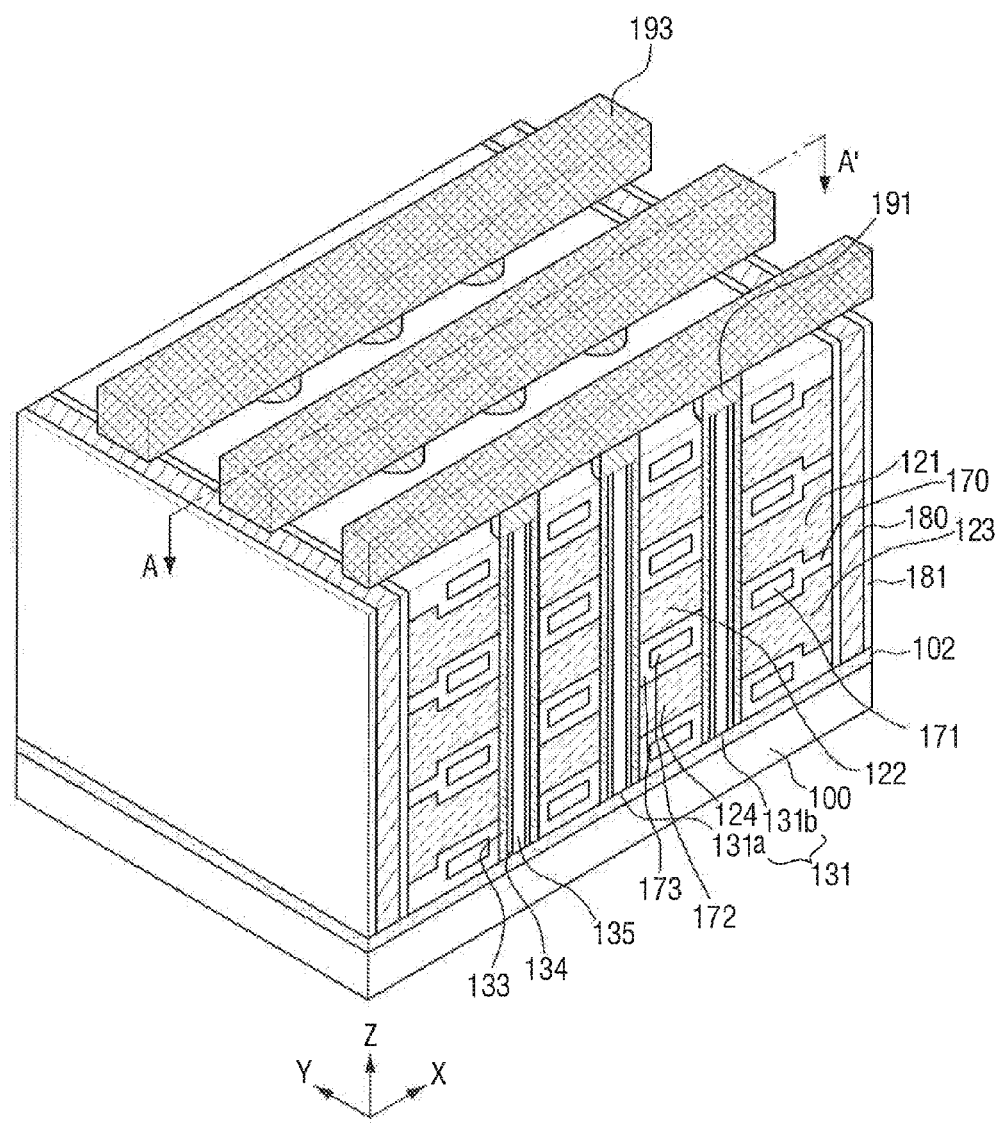
FIG. 2 is a perspective view of a memory block of FIG. 1 according to an exemplary embodiment of the present inventive concept.
Figure 3:
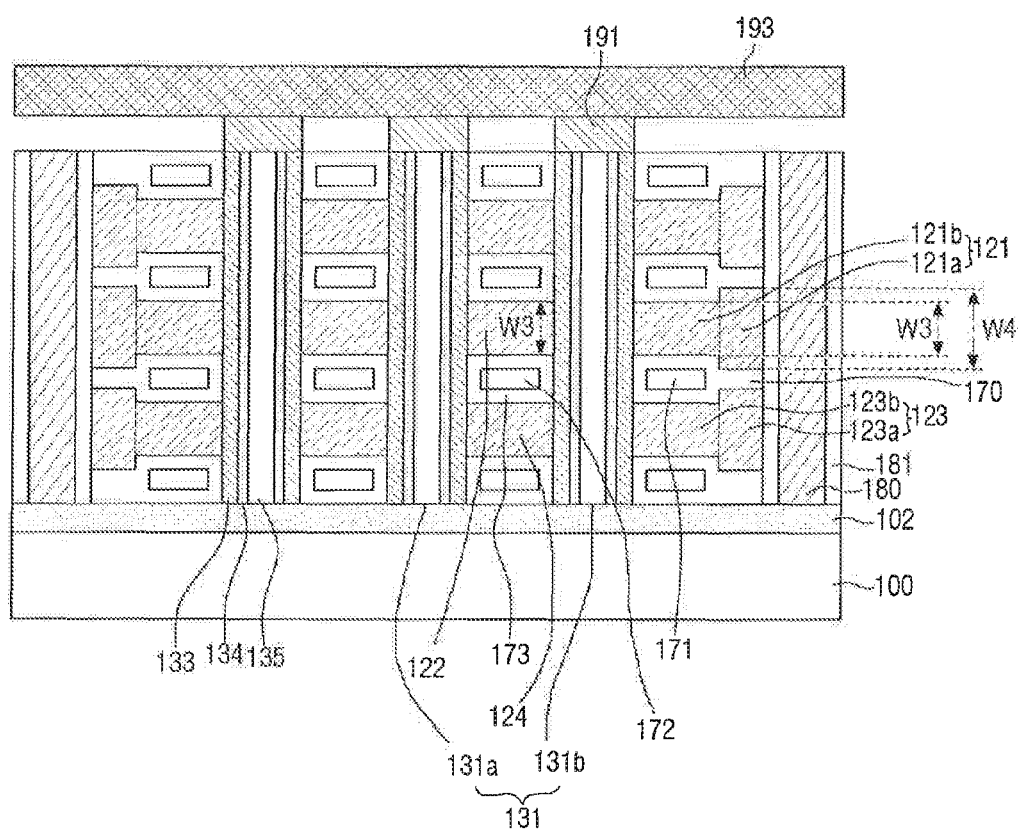
FIG. 3 is a cross-sectional view taken along line A-A' of FIG. 2 according to an exemplary embodiment of the present inventive concept.

Referring to FIGS. 1 to 3, a memory array of a nonvolatile memory device according to an exemplary embodiment of the present inventive concept may include a plurality of memory blocks BLK1 to BLKn (where, n is a natural number).

The respective memory blocks BLK1 to BLKn may extend in first to third directions x, y, and z. The memory blocks BLK1 to BLKn may be three-dimensionally arranged. As illustrated, the first to third directions x, y, and z may be directions which cross each other, and may be different directions. For example, the first to third directions x, y, and z may be directions which cross each other at right angles, but are not limited thereto.

A memory block BLKi (where, $1 \leq i \leq n$, i is a natural number) may include a first interlayer insulating layer 170 including a first air gap 171, a second interlayer insulating layer 173 including a second air gap 172, a first gate electrode 121, a second gate electrode 122, a third gate electrode 123, a fourth gate electrode 124, a first channel layer 131a, a second channel layer 131b, a conductive line 180, and a spacer 181, which are formed on a substrate 100.

The substrate 100 may be, for example, a bulk silicon or Silicon-On-Insulator (SOI). In addition, the substrate 100 may be a silicon substrate, or may include another material, for example, silicon germanium, indium antimonide, lead telluride, indium arsenide, indium phosphide, gallium arsenide, or gallium antimonide. Further, the substrate 100 may be obtained by forming an epitaxial layer on a base substrate.

The substrate 100 may include an impurity region 102 that is provided as a common source line.

The conductive line 180 may be formed to extend vertically with respect to the substrate 100.

The conductive line 180 may include tungsten, but the present inventive concept is not limited thereto. For example, the conductive line 180 may include a conductive material.

The conductive line 180 may be connected to the impurity region 102 of the substrate 100 to operate as a common source line CSL.

The spacer 181 may be formed to extend vertically with respect to the substrate 100. The spacer 181 may be conformally formed on both side walls of the conductive line 180.

The spacer 181 may include, for example, silicon nitride (SiN), silicon oxynitride (SiON), silicon oxide (SiO$_2$), silicon oxycarbide nitride (SiOCN), silicon carbon nitride (SiCN), or a combination thereof.

Channel layers 131 may extend vertically with respect to the substrate 100 to be formed as a line pattern.

The channel layer 131 may include the first channel layer 131a and the second channel layer 131b. The first channel layer 131a may be formed to be spaced apart from the conductive line 180. The second channel layer 131b may be formed between the first channel layer 131a and the conductive line 180.

The channel layers 131 may be formed on the substrate 100 to be arranged in the form of a pillar.

The channel layers 131 may be formed to be spaced apart from each other in the first direction x and in the second direction y. The channel layer 131 may be formed in a channel hole 130 to be described later beginning with FIG. 5. The channel hole 130 may be arranged on the substrate 100 in the form of a matrix.

The channel layer 131 may include an insulating layer 133, a surface layer 134, and an inner layer 135, which extend in the third direction z.

The insulating layer 133 may be arranged on the substrate 100 to extend in the third direction z between the first gate electrode 121, the second gate electrode 122, and the surface layer 134 to be described later.

The insulating layer 133 may include a tunneling insulating layer 136, a charge trap layer 137, and a blocking insulating layer 138. These will be described later beginning with FIG. 11a.

The tunneling insulating layer 136 may be a portion through which a charge passes between the surface layer 134 and the charge trap layer 137. The tunneling insulating layer 136 may be, for example, a silicon oxide layer or a silicon nitride layer, or may be formed as a bilayer of the silicon oxide layer and the silicon nitride layer.

The charge trap layer 137 may be arranged between the blocking insulating layer 138 and the tunneling insulating layer 136. The charge trap layer 137 may be a portion in which the charge that has passed through the tunneling insulating layer 136 is stored.

The charge trap layer 137 may be formed of, for example, a nitride layer or a high-k layer. The nitride layer may include, for example, silicon nitride, silicon oxynitride, hafnium oxynitride, zirconium oxynitride, hafnium silicon oxynitride, or hafnium aluminum oxynitride. The high-k layer may include, for example, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

The blocking insulating layer 138 may prevent the charge that is captured in the charge trap layer 137 from being discharged to a gate electrode. Further, the blocking insulating layer 138 may prevent the charge of the gate electrode from being captured in the charge trap layer 137.

The blocking insulating layer 138 may include an insulating metal oxide having a dielectric constant that is equal to or higher than that of silicon oxide. For example, the blocking insulating layer may be formed as a multilayer in which a high-k material, such as aluminum oxide, hafnium oxide, lanthanum oxide, tantalum oxide, titanium oxide, lanthanum hafnium oxide, lanthanum aluminum oxide, or dysprosium scandium oxide, or a combination thereof is laminated.

The surface layer 134 may be arranged on the substrate 100 to extend in the third direction z between the insulating layer 133 and the inner layer 135.

The surface layer 134 may include, for example, a semiconductor material, such as single crystalline silicon.

The surface layer 134 may be arranged between the insulating layer 133 and the inner layer 135, and may operate as a channel region. In other words, the surface layer 134 may provide the charge to be trapped or discharged by the insulating layer 133.

A plurality of the inner layers 135 may be formed on the substrate 100 to extend in the third direction Z, and may be arranged to be spaced apart from each other in the first direction x and in the second direction y.

For example, the inner layer 135 may be arranged on the substrate 100 in the form of a pillar, and may penetrate the first gate electrode 121, the first interlayer insulating layer 170, the second gate electrode 122, and the second interlayer insulating layer 173, which are alternately laminated.

For example, the inner layer 135 may successively form the insulating layer 133 and the surface layer 134 along the side wall of the channel hole 130 to be described later beginning with FIG. 5, and then may fill the remaining space of the channel hole 130.

In the case where a plurality of channel holes 130 are provided, the first gate electrode 121, the first interlayer insulating layer 170, the second gate electrode 122, and the second interlayer insulating layer 173, which are alternately laminated, may be arranged on both sides of the inner layer 135.

The inner layer 135 may include an insulating material. For example, the inner layer 135 may be formed using poly silazane (PSZ), but the present inventive concept is not limited thereto. For example, the inner layer 135 may be formed of an insulating material having high fluidity to fill the remaining space of the channel hole 130 without void.

The present inventive concept is not limited by the number of channel layers illustrated in FIGS. 2 and 3. For example, the memory blocks BLK1 to BLKn may include at least one channel layer.

The first gate electrode 121 may be formed between the conductive line 180 and the second channel layer 131b.

The first gate electrode 121 may include a first portion 121a having a first thickness W4 and a second portion 121b having a second thickness W3.

The first portion 121a may be closer to the conductive line 181 than the second portion 121b.

The first thickness W4 and the second thickness W3 may be different from each other. For example, the first thickness W4 may be larger than the second thickness W3.

The second gate electrode 122 may be arranged between the first channel layer 131a and the second channel layer 131b.

The shape of the first gate electrode 121 may be different from the shape of the second gate electrode 122. For example, the second gate electrode 122 may have the second thickness W3.

The third gate electrode 123 may be formed between the conductive line 180 and the second channel layer 131b.

The third gate electrode 123 may include a third portion 123a that corresponds to the first portion 121a of the first gate electrode 121 and a fourth portion 123b that corresponds to the second portion 121b of the first gate electrode 121.

For example, the shape of the first gate electrode 121 may be equal to the shape of the third gate electrode 123.

The fourth gate electrode 124 may be arranged between the first channel layer 131a and the second channel layer 131b.

The shape of the fourth gate electrode 124 may be, for example, equal to the shape of the second gate electrode 122.

The first to fourth gate electrodes 121 to 124 may extend in the second direction y with respect to the substrate 100, and may be laminated in the third direction z.

The first to fourth gate electrodes 121 to 124 may be formed to cross the first channel layer 131a and the second channel layer 131b.

The first to fourth gate electrodes 121 to 124 may include conductive materials. For example, the gate electrodes 121 and 122 may include a conductive material, such as tungsten (W), cobalt (Co), or nickel (Ni), or a semiconductor material, such as silicon, but the present inventive concept is not limited thereto. For example, the first to fourth gate electrodes 121 to 124 may not be a single layer, and in the case where the first to fourth gate electrodes 121 to 124 have a multilayer structure, the first to fourth gate electrodes 121 to 124 may further include different conductive materials and insulating materials.

The first to fourth gate electrodes 121 to 124 may operate as word lines.

The first and second gate electrodes 121 and 122 may operate as one word line, and the third and fourth gate electrodes 123 and 124 may operate as another word line.

The first interlayer insulating layer 170 may be formed between the first gate electrode 121 and the third gate electrode 123. The first interlayer insulating layer 170 may be formed between the conductive line 180 and the second channel layer 131b.

The second interlayer insulating layer 173 may be formed between the second gate electrode 122 and the fourth gate electrode 124. The second interlayer insulating layer 173 may be formed between the first channel layer 131a and the second channel layer 131b.

Each of the first and second interlayer insulating layers 170 and 173 may be formed to extend in the second direction y.

The shapes of the first and second interlayer insulating layers 170 and 173 may be different from each other. The details thereof will be described later with reference to FIG. 18.

The first and second interlayer insulating layers 170 and 173 may include, for example, a low-k material, an oxide layer, a nitride layer, or an oxynitride layer. The low-k material may be made of, for example, Flowable Oxide (FOX), Tonen SilaZen (TOSZ), Undoped Silica Glass (USG), Borosilica Glass (BSG), PhosphoSilica Glass (PSG), BoroPhosphoSilica Glass (BPSG), Plasma Enhanced Tetra Ethyl Ortho Silicate (PETEOS), Fluoride Silicate Glass (FSG), High Density Plasma (HDP), Plasma Enhanced Oxide (PEOX), Flowable Chemical Vapor Deposition (FCVD), or a combination thereof, but are not limited thereto. The first interlayer insulating layer 170 may include the first air gap 171, and the second interlayer insulating layer 173 may include the second air gap 172.

The first air gap 171 may be arranged between the first gate electrode 121 and the third gate electrode 123.

The first air gap 171 may be arranged between the second portion 121b of the first gate electrode 121 and the fourth portion 123b of the third gate electrode 123, but the present inventive concept is not limited thereto.

For example, a part of the first air gap 171 may also be arranged between the first portion 121a of the first gate electrode 121 and the third portion 123a of the third gate electrode 123.

The second air gap 172 may be arranged between the second gate electrode 122 and the fourth gate electrode 124.

A plurality of drains 191 may be formed on the first channel layer 131a and the second channel layer 131b, and may be connected to a plurality of bit lines 193.

The plurality of bit lines 193 may be electrically connected to the plurality of drains 191, but the present inventive concept is not limited thereto. For example, the plurality of bit lines 193 may be electrically connected to each other through a contact plug. Further, the contact plug may also be formed on a first conductive line and a second conductive line.

A memory cell included in a three-dimensional (3D) memory array may include the first to fourth gate electrodes 121 to 124, the first interlayer insulating layer 170, and the second interlayer insulating layer 173. Further, a plurality of memory cells may be provided.

Each channel layer (e.g., the first channel layer 131a or the second channel layer 131b) may form a memory string together with the gate electrode that is adjacent to the channel layer. In other words, the memory string may include a plurality of transistor structures. Further, the memory string may be vertically formed with respect to the substrate 100.

The memory string may be included in the 3D memory array, and a plurality of memory strings may be provided.

Hereinafter, referring to FIGS. 4 to 25, a method for fabricating a nonvolatile memory device according to an exemplary embodiment of the present inventive concept will be described.

FIGS. 4 to 25 are views of steps of a method for fabricating a nonvolatile memory device according to an exemplary embodiment of the present inventive concept.

Figure 6:
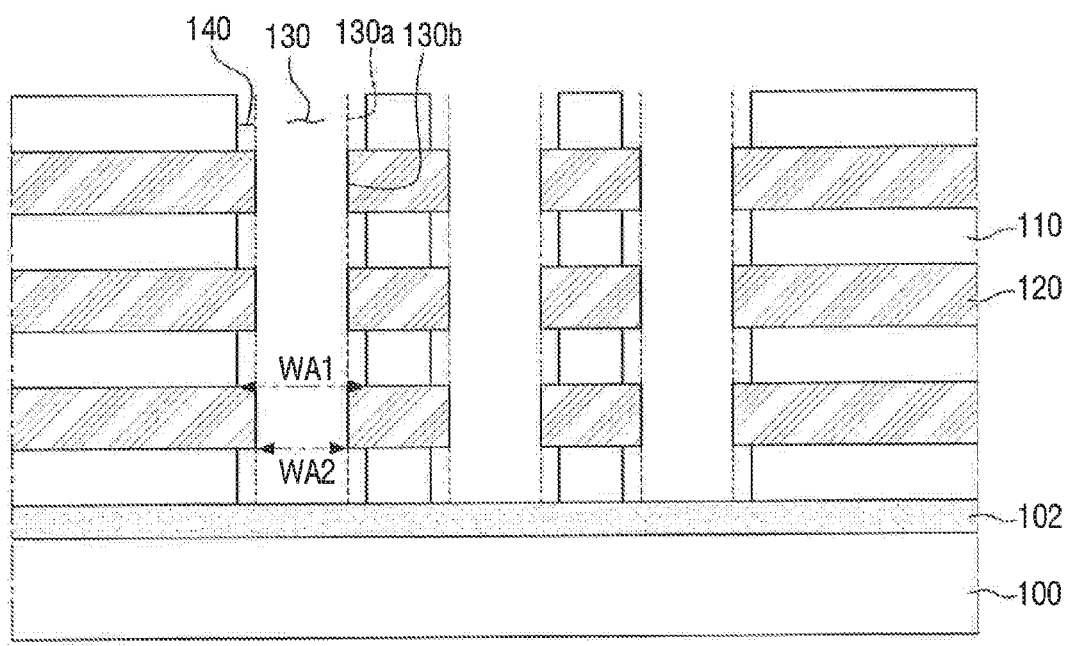
Figure 7:
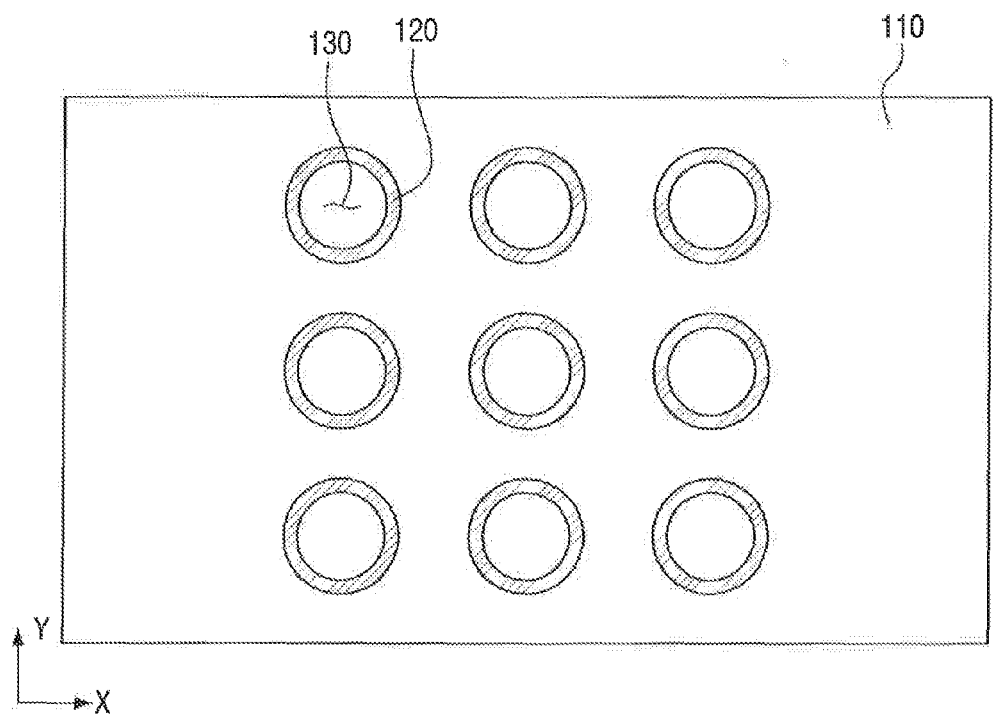
Figure 10:
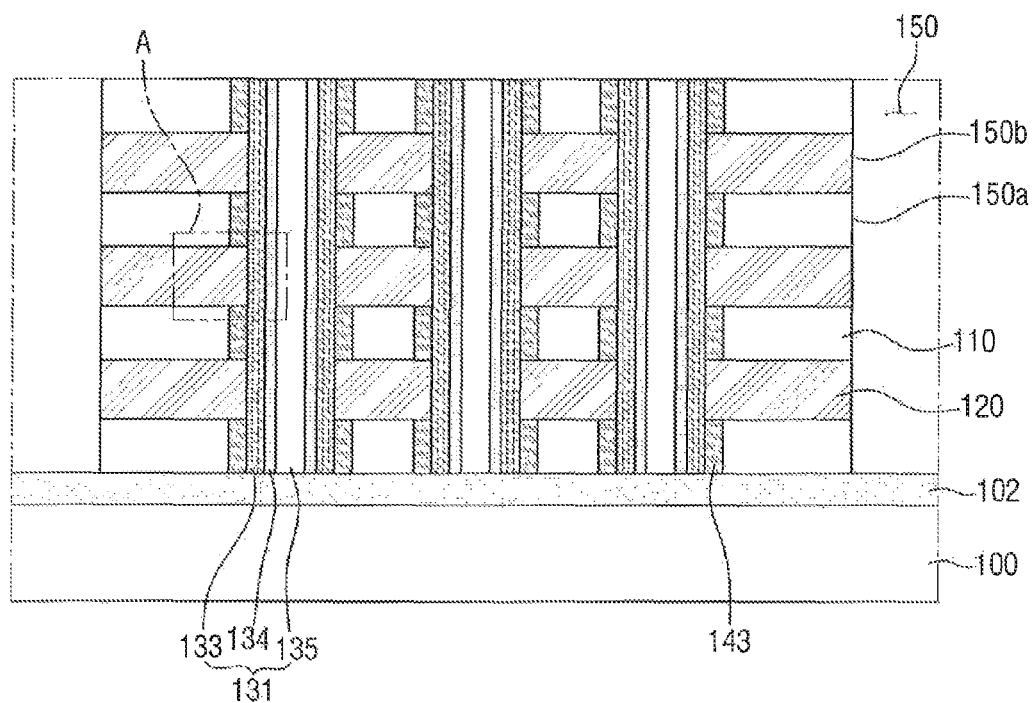
Figure 11A:
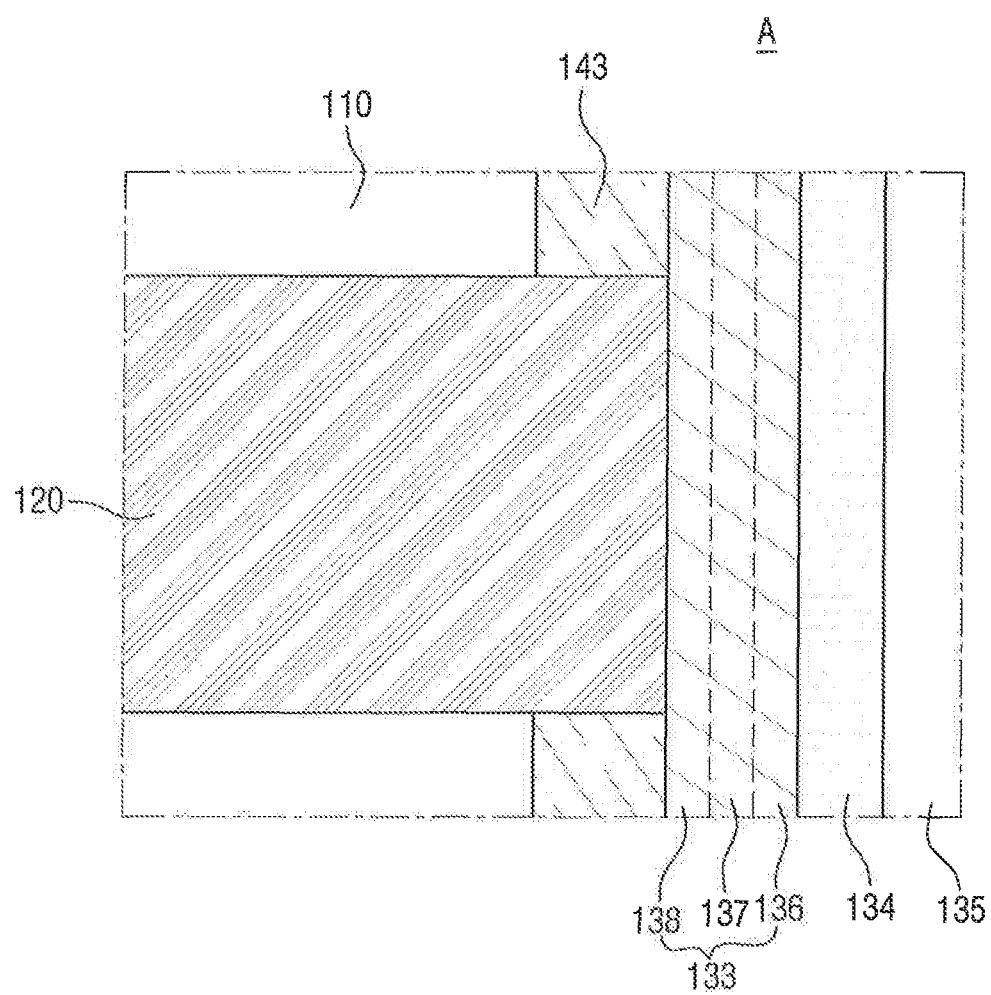
Figure 11B:
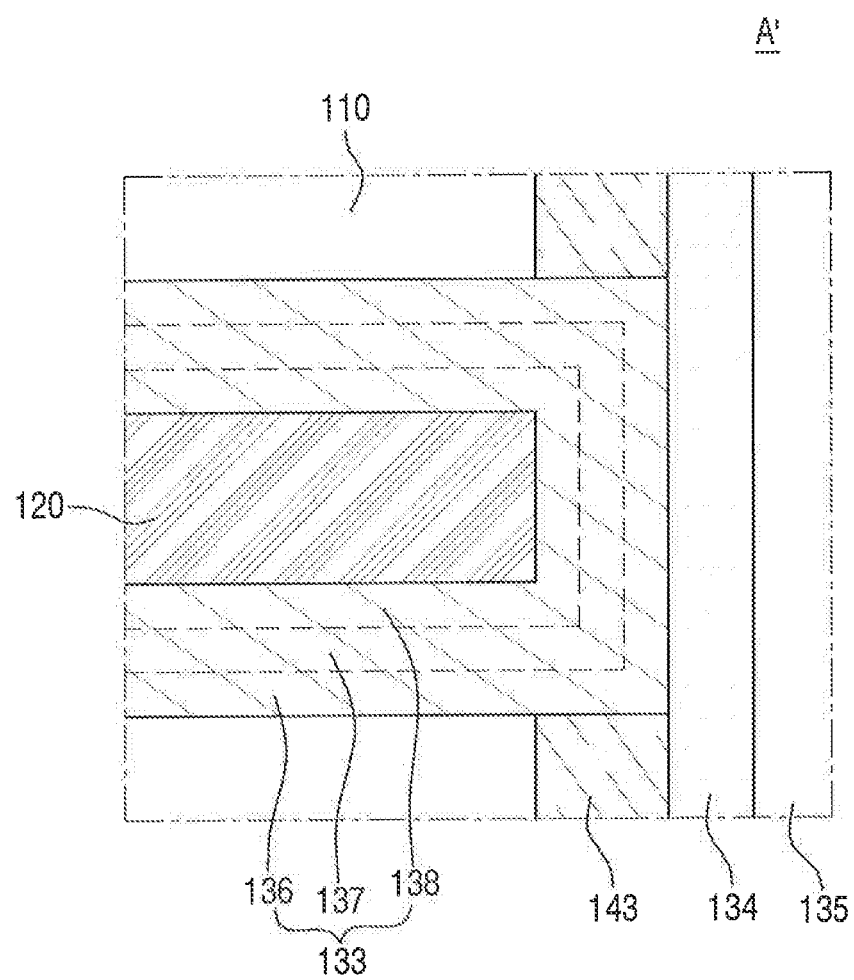

FIG. 7 is a top view of a nonvolatile memory device illustrated in FIG. 6 as seen from the top of the nonvolatile memory device, and FIGS. 11A and 11B are enlarged views of portion A of FIG. 10.

Figure 4:
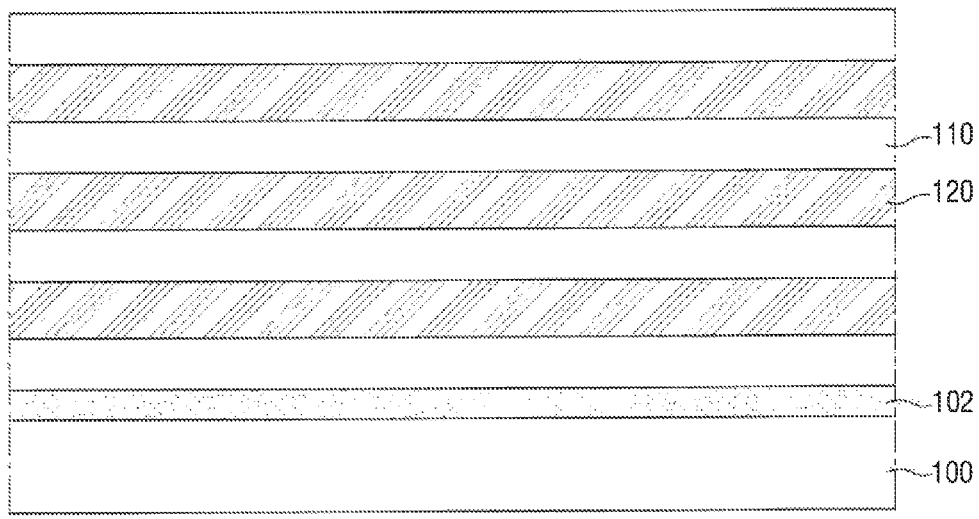
FIGS. 4, 5, 6, 7, 8, 9, 10, 11a, 11b, 12, 13, 14, 15, 16, 17, 18, 19, 20, 21, 22, 23, 24 and 25 are views of steps of a method for fabricating a nonvolatile memory device according to an exemplary embodiment of the present inventive concept.

Referring to FIG. 4, a mold layer that includes a first sacrificial layer 110 and a second sacrificial layer 120, which are alternately laminated, may be formed on a substrate 100.

The substrate 100 may include an impurity region 102, and in this case, the first sacrificial layer 110 and the second sacrificial layer 120 may be alternately laminated on the impurity region 102.

The first sacrificial layer 110 and the second sacrificial layer 120 may extend in a first direction x, and may be alternately laminated in a third direction z. A laminated structure which includes the first sacrificial layer 110 and the second sacrificial layer 120 that are alternately laminated is called the mold layer.

On the lowermost layer and the uppermost layer of the mold layer, the first sacrificial layer 110 may be positioned.

A plurality of first and second sacrificial layers 110 and 120 that are alternately laminated may be provided. For example, the number of the first and second sacrificial layers 110 and 120 that are alternately laminated may differ depending on memory capacity.

The first sacrificial layer 110 may be formed of a material having an etch selectivity over the second sacrificial layer 120. The first sacrificial layer 110 may be formed of a silicon oxide layer, and the second sacrificial layer 120 may be formed of a silicon nitride layer, but the present inventive concept is not limited thereto.

For example, the first sacrificial layer 110 and the second sacrificial layer 120 may be formed of silicon oxide layers having a different etch selectivity.

Figure 5:
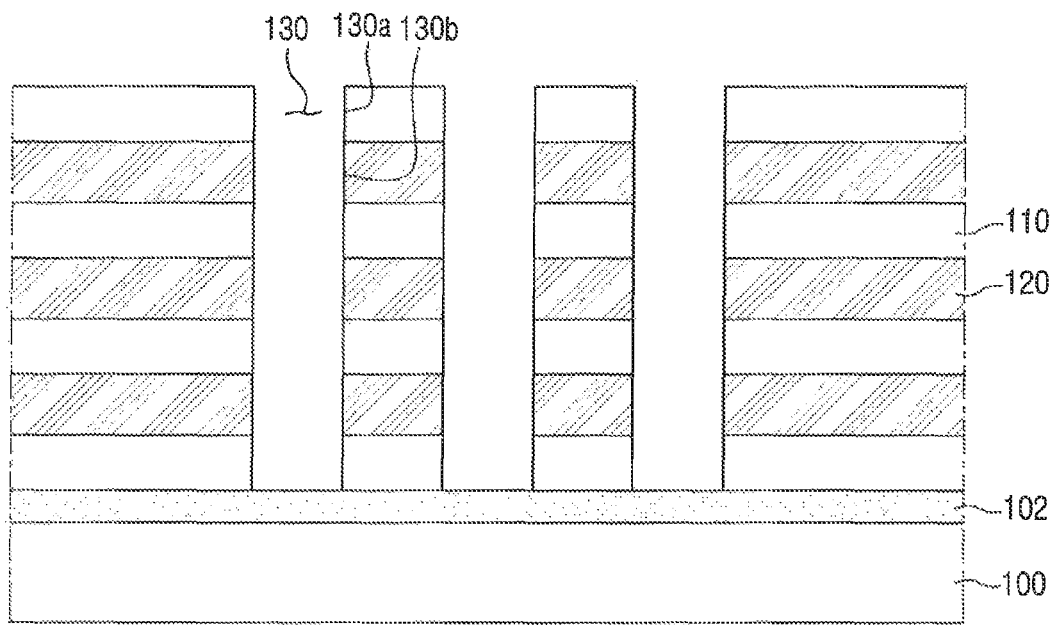

Referring to FIG. 5, a channel hole 130 for exposing the substrate 100 may be formed in the mold layer.

The channel hole 130 may be formed, for example, by performing photo and etching processes.

In the case where the substrate 100 includes the impurity region 102, the channel hole 130 may be formed in the mold layer to expose the impurity region 102 included in the substrate 100.

The channel hole 130 may be formed in the form of a line in the third direction z. FIG. 5 illustrates that a side wall of the channel hole 130 crosses an upper surface of the substrate 100 at right angles, but the present inventive concept is not limited thereto. For example, the side wall of the channel hole 130 may not cross the upper surface of the substrate 100 at right angles. In other words, the side wall of the channel hole 130 may have a tilt.

A plurality of channel holes 130 may be formed in the mold layer.

Through forming of the channel hole 130, the side walls of the first and second sacrificial layers 110 and 120 that are alternately laminated may be exposed. In other words, the channel hole 130 may include a first portion 130a that is defined by the first sacrificial layer 110 and a second portion 130b that is defined by the second sacrificial layer 120.

Referring to FIG. 6, a first recess 140 may be formed through removal of a part of the first sacrificial layer 110 that is exposed by the channel hole 130.

The first recess 140 may be formed on the first portion 130a of the channel hole 130.

The first recess 140 may be formed, for example, through a wet etching process. An etchant used in the wet etching process may be, for example, hydrofluoric acid (HF), but the present inventive concept is not limited thereto.

For example, the first recess 140 may be formed using the etch selectivity between the first sacrificial layer 110 and the second sacrificial layer 120.

In this case, the width of the first portion 130a of the channel hole 130 may extend (e.g., increase) through forming of the first recess 140.

An even side wall of the channel hole 130 may become uneven due to the first recess 140. In other words, in the case of increasing the width of the first portion 130a, the first portion 130a may be recessed to make the side wall of the channel hole 130 uneven.

Referring to FIG. 7, since the first portion 130a is recessed, the second sacrificial layer 120 may be exposed along the upper surface of the side wall of the channel hole 130.

Referring again to FIG. 6, after the width of the first portion 130a of the channel hole 130 increases, the width $W_{A1}$ of the first portion 130a may become larger than the width $W_{A2}$ of the second portion 130b.

In this case, the width $W_{A1}$ of the first portion 130a and the width $W_{A2}$ of the second portion 130b may be widths of boundary surfaces of the first sacrificial layer 110 and the second sacrificial layer 120.

The increasing of the width of the first portion 130a of the channel hole 130 may include selectively etching of a part of the first sacrificial layer 110.

Figure 8:
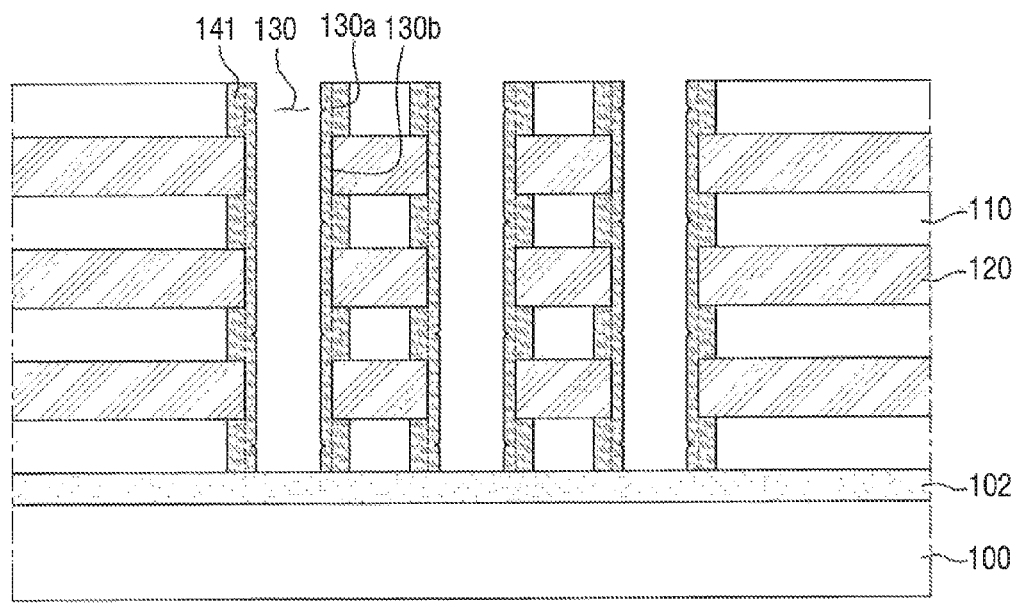

Referring to FIG. 8, an etch stop layer 141 may be formed along the side wall of the channel hole 130 while filling the first recess 140.

In other words, the etch stop layer 141 may be formed along the side wall of the second portion 130b of the channel hole 130 and the widened side wall of the first portion 130a of the channel hole 130.

Figure 9:
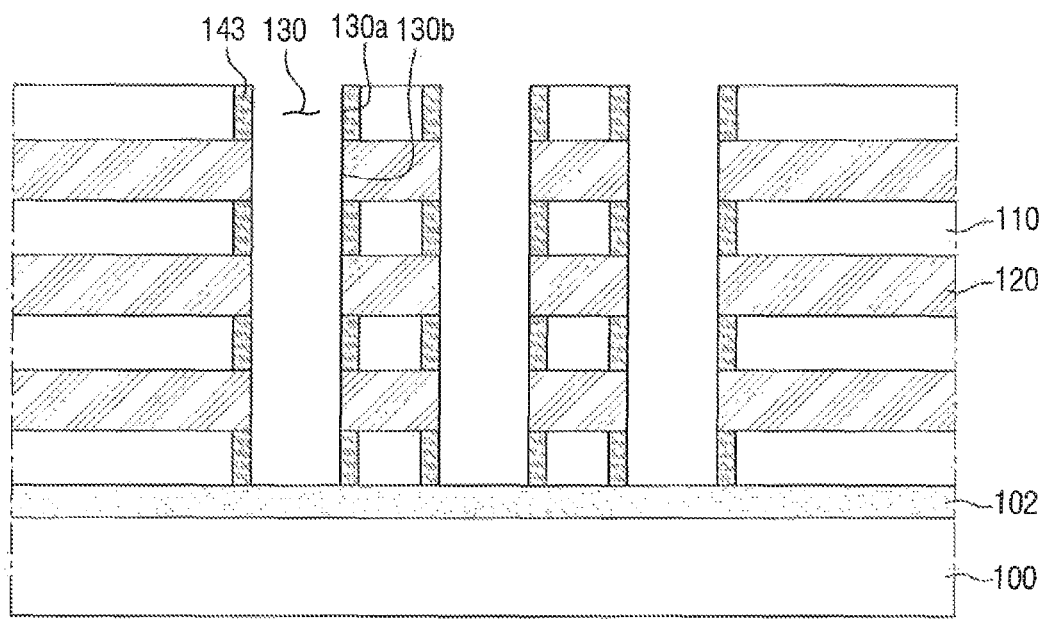

Referring to FIG. 9, the etch stop layer 141 that is formed on the second sacrificial layer 120 may be removed, and an etch stop pattern 143 may be formed on the first sacrificial layer 110 that is exposed by the channel hole 130.

The etch stop pattern 143 may be formed on the first portion 130a of the channel hole 130 through removal of the etch stop layer 141 on the second portion 130b of the channel hole 130.

The etch stop pattern 143 may be made of polysilicon, but the present inventive concept is not limited thereto. For example, the etch stop pattern 143 may be formed of a material having an etch selectivity over the first sacrificial layer 110 and the second sacrificial layer 120.

Removal of the etch stop pattern 143 may be performed, for example, through a wet etching process. In this case, an etchant used in the wet etching process may be ammonium hydroxide, but the present inventive concept is not limited thereto. For example, in removing the etch stop pattern 143, a wet etching process using an etchant having an etch selectivity over the first sacrificial layer 110 and the second sacrificial layer 120 may be performed. Further, the removal of the etch stop pattern 143 may be performed, for example, through a dry etching process.

The etch stop pattern 143 may protect the first sacrificial layer 110 against an etch material that is used to remove the first sacrificial layer 110 as will be described later.

Referring to FIGS. 10 to 11A, a channel layer 131 may be formed in the channel hole 130 on which the etch stop pattern 143 is formed.

As described above with reference to FIG. 2, the channel layer 131 may include a plurality of layers. For example, the channel layer 131 may include an insulating layer 133, a surface layer 134, and an inner layer 135. For briefness, duplicate descriptions will be omitted.

The insulating layer 133 may be formed along the side wall of the channel hole 130, and then the surface layer 134 and the inner layer 135 may be successively formed. However, the present inventive concept is not limited thereto.

For example, the channel layer 131 may not include the inner layer 135. Further, a portion of the inner layer 135 may be formed as a conductive pattern.

The insulating layer 133 may include a tunneling insulating layer 136, a charge trap layer 137, and a blocking insulating layer 138.

The tunneling insulating layer 136, the charge trap layer 137, and the blocking insulating layer 138 may be successively formed in the direction from the side wall of the inner layer 135 to the side wall of the channel hole 130. In other words, the blocking insulating layer 138 may be formed along the side wall of the channel hole 130, the charge trap layer 137 may be formed on the blocking insulating layer 138, and the tunneling insulating layer 136 may be formed on the charge trap layer 137.

The inner layer 135 may be formed to fill an empty space of the channel hole 130 after forming the insulating layer 133 and the surface layer 134 on the channel hole 130.

Although FIGS. 10 and 11A illustrate that the insulating layer 133 extends in the third direction z along the side wall of the channel hole 130, the present inventive concept is not limited thereto. For example, the insulating layer 133 may be formed as illustrated in FIG. 11B.

Referring to FIG. 11B, the insulating layer 133 may be formed to surround the second sacrificial layer 120. In other words, the insulating layer 133 may be formed in a zigzag in the third direction z.

For example, the insulating layer 133 may be formed between the second sacrificial layer 120 and the first sacrificial layer 110, and the etch stop pattern 143 which are arranged above the second sacrificial layer 120. In addition, the insulating layer 133 may be formed between the second sacrificial layer 120 and the first sacrificial layer 110, and the etch stop pattern 143, which are arranged below the second sacrificial layer 120. Further, the insulating layer 133 may be formed between the surface layer 134 and the sacrificial layer 120. However, the present inventive concept is not limited thereto.

For example, only the blocking insulating layer 138 of the insulating layer 133 may be formed in a zigzag.

The insulating layer 133 may be conformally formed along the sides of the gate electrodes 121 and 122 (in FIG. 2) and interlayer insulating layers 170 and 173 (in FIG. 2).

Referring again to FIG. 10, after the channel layer 131 is formed, a trench 150 for exposing the substrate 100 may be formed to be spaced apart from the channel layer 131 in the mold layer.

The trench 150 may be formed by patterning the first sacrificial layer 110 and the second sacrificial layer 120 in the form of a line. In other words, the trench 150 may expose the side walls of the first sacrificial layer 110 and the second sacrificial layer 120.

A plurality of trenches 150 may be formed to be arranged between a plurality of channel layers 131 arranged in the first direction x. The trench 150 may include a first trench portion 150a that is defined by the first sacrificial layer 110 that is exposed through the trench 150, and a second trench portion 150b that is defined by the second sacrificial layer 120 that is exposed through the trench 150.

The trench 150 may be formed by performing photo and etching processes with respect to the first sacrificial layer 110 and the second sacrificial layer 120.

Figure 12:
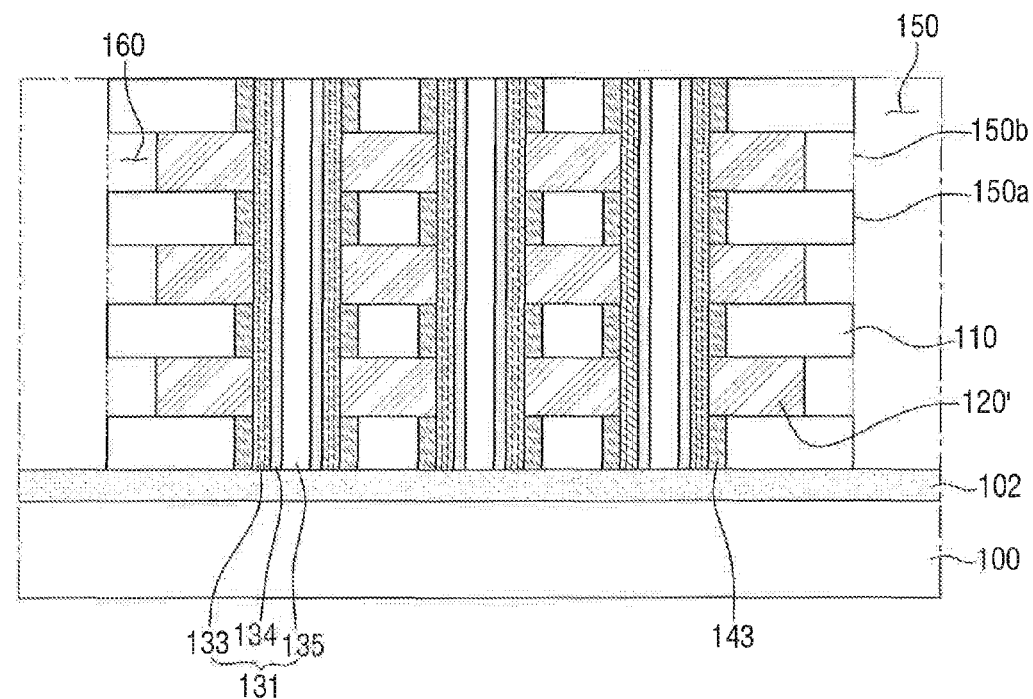

Referring to FIG. 12, a second recess 160 may be formed through removal of a part of the second sacrificial layer 120 that is exposed through the trench 150.

The second recess 160 may be formed on the second trench portion 150b.

An even side wall of the trench 150 may become uneven due to the second recess 160. In other words, the second trench portion 150b may be recessed to make the side wall of the trench 150 uneven.

The second recess 160 may be formed between the channel layer 131 that is adjacent to the trench 150 and the trench 150.

Due to the second recess 160, the shape of the remaining second sacrificial layer 120' that is arranged between the channel layer 131 that is adjacent to the trench 150 and the trench 150 may differ from the shape of the second sacrificial layer 120 that is arranged between the channel layer 131 that is adjacent to the trench 150 and another of the plurality of channel layers 131.

The second recess 160 may be formed using an etch selectivity between the first sacrificial layer 110 and the second sacrificial layer 120. In other words, forming of the second recess 160 may include selective etching of a part of the second sacrificial layer 120.

Figure 13:
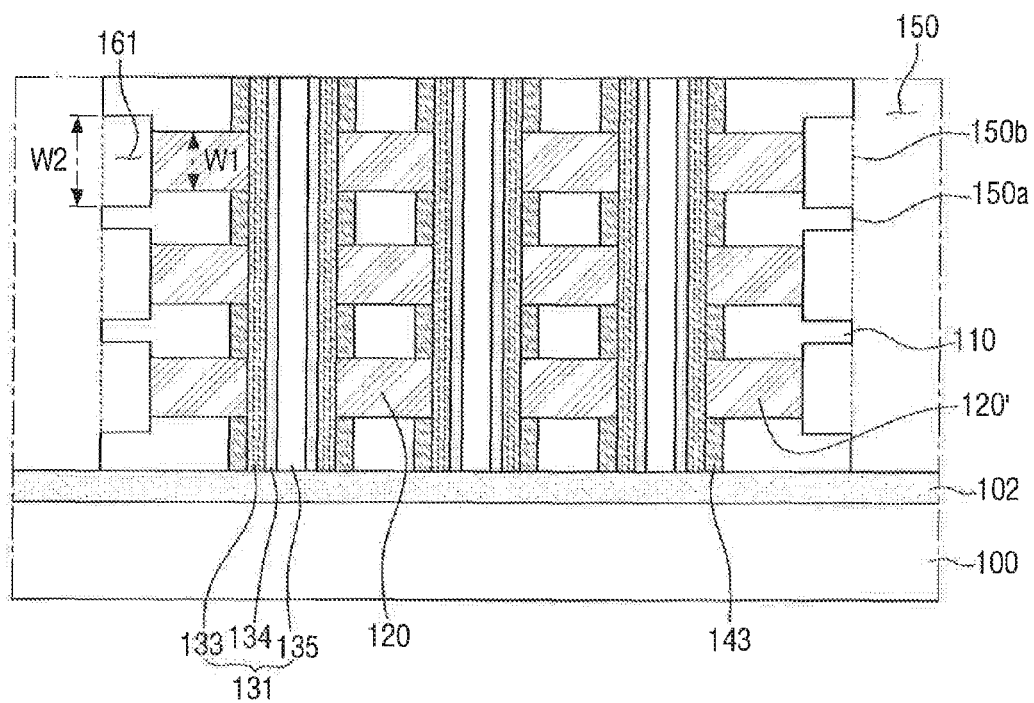

Referring to FIG. 13, a third recess 161 may be formed by extending the width W1 of the second recess 160 in the thickness direction of the substrate 100.

The third recess 161 may be formed on the second trench portion 150b.

The third recess 161 may be formed between the channel layer 131 that is adjacent to the trench 150 and the trench 150.

Here, the thickness direction may be the third direction z.

The width W2 in the thickness direction of the third recess 161 may be larger than the width W1 in the thickness direction of the remaining second sacrificial layer 120' after the second recess 160 is formed.

In other words, in the forming of the third recess 161, the width in the thickness direction of the second trench portion 150b before the third recess 161 is formed may be increased. In this case, the width in the thickness direction of the first trench portion 150a before the third recess 161 is formed may be shortened.

The third recess 161 may be formed through removal of a part of the first sacrificial layer 110 that is exposed by the trench 150.

The forming of the third recess 161 may include selective etching of a part of the first sacrificial layer 110. In the etching process, hydrofluoric acid (HF) may be used, but the present inventive concept is not limited thereto.

For example, the third recess 161 may be formed using the etch selectivity between the first sacrificial layer 110 and the remaining second sacrificial layer 120'.

Figure 14:
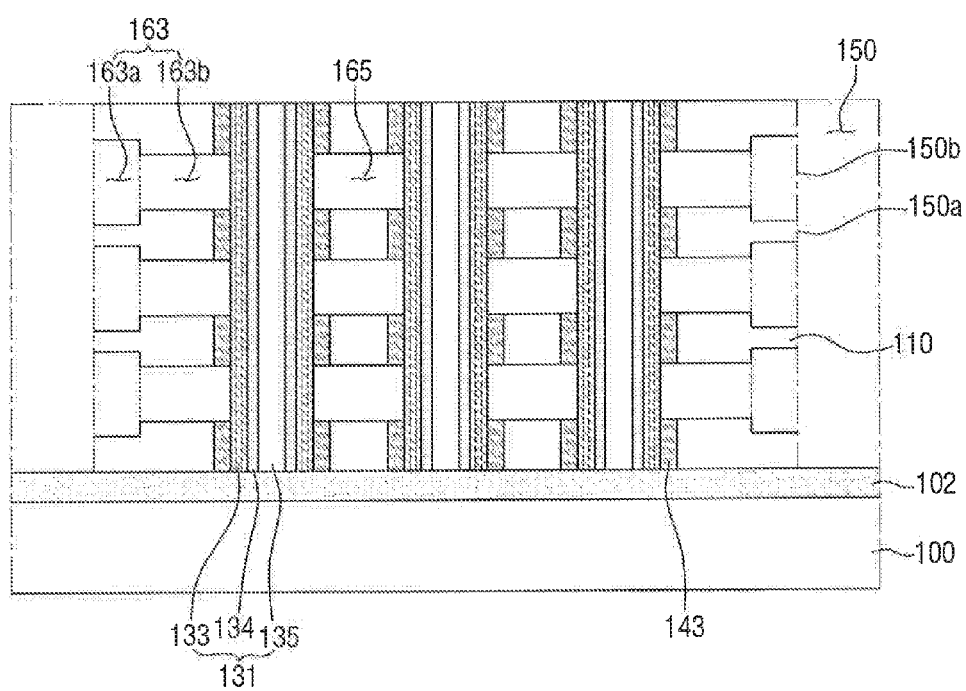

Referring to FIG. 14, after the third recess 161 is formed, a second extension portion 163 may be formed through removal of the remaining second sacrificial layer 120'.

The second extension portion 163 may be formed on the second trench portion 150*b*.

The second extension portion 163 may be formed between the channel layer 131 that is adjacent to the trench 150 and the trench 150.

Further, a third extension portion 165 may be formed through removal of the second sacrificial layer 120 that is formed between the channel layer 131 that is adjacent to the trench 150 and another of the plurality of channel layers 131.

The third extension portion 165 may be formed between the channel layer 131 that is adjacent to the trench 150 and another channel layer 131 among the plurality of channel layers 131 that are formed between the trenches 150.

The second extension portion 163 may include, for example, a first portion 163*a* including a surface that is exposed by the trench 150 and a second portion 163*b* that is positioned between the first portion 163*a* and the channel layer 131.

The width in the thickness direction of the first portion 163*a* of the second extension portion 163 may be larger than the width in the thickness direction of the second portion 163*b* of the second extension portion 163.

In addition, the shape of the third extension portion 165 may be different from, for example, the shape of the second extension portion 163.

The width in the thickness direction of the third extension portion 165 may be constant. For example, the width in the thickness direction of the third extension portion 165 may be equal to the width in the thickness direction of the second portion 163*b* of the second extension portion 163.

The second extension portion 163 and the third extension portion 165 may be formed using an etch selectivity between the first sacrificial layer 110, the insulating layer 133, the etch stop pattern 143, and the second sacrificial layer 120. For example, the forming of the second extension portion 163 may include selective etching of the remaining second sacrificial layer 120' after the third recess 161 is formed.

Figure 15:
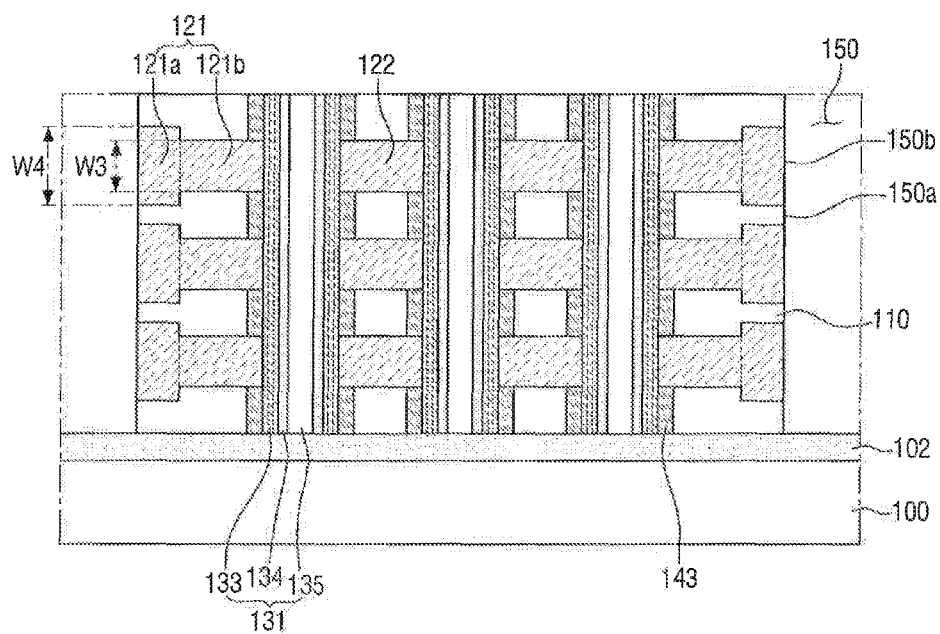

Referring to FIG. 15, the first gate electrode 121 that fills the second extension portion 163 may be formed.

In this case, the second gate electrode 122 that fills the third extension portion 165 may also be formed.

Forming of the first gate electrode 121 and the second gate electrode 122 may include a node separation process. For example, the forming of the first gate electrode 121 and the second gate electrode 122 may include a process of removing a conductive material that is formed on the first sacrificial layer 110 that is exposed through the trench 150 after the second extension portion 163 and the third extension portion 165 are filled with the conductive material.

Removal of the conductive material may be performed through an etching process using an etch selectivity between the first sacrificial layer 110 and the conductive material.

In this case, for example, the conductive material on the side of the trench 150 may be over-etched to form a recess, or the first sacrificial layer 110 that is exposed through the trench 150 may project from the gate electrode 121.

The first gate electrode 121 and the second gate electrode 122 may be formed between the first sacrificial layers 110 that are vertically adjacent to the substrate 100. Further, the first gate electrode 121 and the second gate electrode 122 may be formed to cross the channel layer 131.

The first gate electrode 121 may be formed on the second trench portion 150*b*. The first gate electrode 121 may be formed between the channel layer 131 that is adjacent to the trench 150 and the trench 150.

Further, the second gate electrode 122 may be formed between the channel layer 131 that is adjacent to the trench 150 and another of the plurality of channel layers 131.

The first gate electrode 121 may include a first portion 121*a* and a second portion 121*b*. The first portion 121*a* may include an exposure surface that is exposed by the trench 150. The second portion 121*b* may be positioned between the first portion 121*a* and the channel layer 131.

In this case, the thickness W4 between the first sacrificial layers 110 that are vertically adjacent to the first portion 121*a* may be different from the thickness W3 of the second portion 121*b*. For example, the thickness W4 of the first portion 121*a* may be larger than the thickness W3 of the second portion 121*b*.

In addition, the shape of the second gate electrode 122 may be, for example, different from the shape of the first gate electrode 121.

The thickness between the first sacrificial layers 110 that are vertically adjacent to the second gate electrode 122 may be constant. For example, the thickness of the second gate electrode 122 may be equal to the thickness W3 of the second portion 121*b*.

Figure 16:
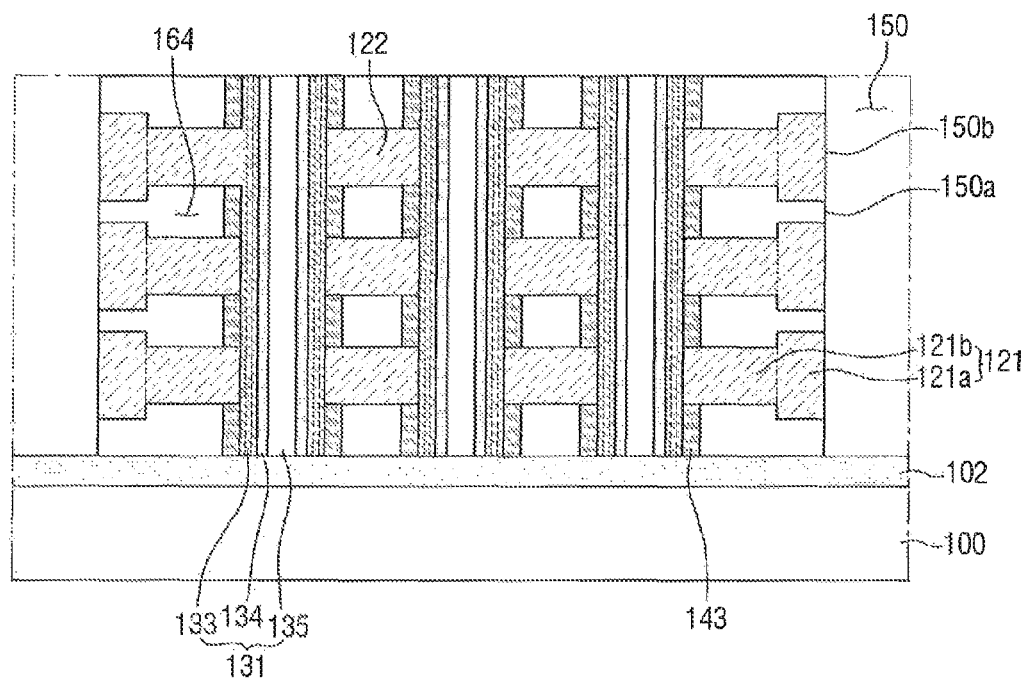

Referring to FIG. 16, after the first gate electrode 121 and the second gate electrode 122 are formed, an empty space 164 may be formed through removal of the first sacrificial layer 110 that is exposed through the trench 150.

The empty space 164 may be formed on the first trench portion 150*a*. In other words, the empty space 164 may be formed between the channel layer 131 that is adjacent to the trench 150 and the trench 150. In this case, the first sacrificial layer 110 between the channel layer 131 that is adjacent to the trench 150 and another of the plurality of channel layers 131 may remain without being removed.

Further, the etch stop pattern 143 may remain without being removed.

The empty space 164 may be formed, for example, through a wet etching process. An etchant used in the wet etching process may be, for example, hydrofluoric acid (HF), but is not limited thereto.

For example, the empty space 164 may be formed using an etch selectivity between the first sacrificial layer 110, the first gate electrode 121, and the etch stop pattern 143. In other words, forming of the empty space 164 may include selective etching of the first sacrificial layer 110 that is exposed through the trench 150.

If the etch stop pattern 143 is not formed when the first sacrificial layer 110 that is exposed through the trench 150 is removed, the blocking insulating layer 138 that does not have etch selectivity over the first sacrificial layer 110 may be etched.

According to the method for fabricating a nonvolatile memory device according to an exemplary embodiment of the present inventive concept, the etch stop pattern 143, as described above, may be formed of a material having an etch selectivity over the first gate electrode 121, the second gate electrode 122, the first sacrificial layer 110, and the second sacrificial layer 120. Accordingly, the etch stop pattern 143 may prevent unnecessary etching in the process of removing the first sacrificial layer 110 that is exposed through the trench 150.

Figure 17:
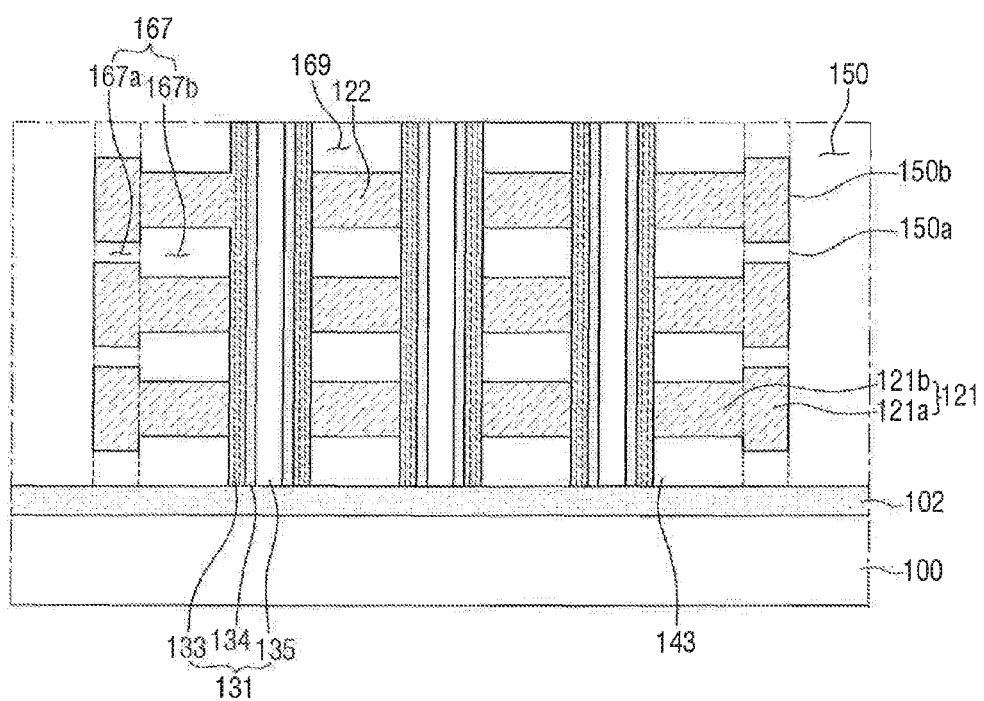

Referring to FIG. 17, a first extension portion 167 may be formed through removal of the etch stop pattern 143.

The first extension portion 167 may be formed on the first trench portion 150*a*. In other words, the first extension portion 167 may be formed between the channel layer 131 that is adjacent to the trench 150 and the trench 150.

Further, a fourth extension portion 169 may be formed between the channel layer 131 that is adjacent to the trench 150 and another of the plurality of channel layers 131. In other words, the first sacrificial layer 110 and the etch stop pattern 143 between the channel layer 131 that is adjacent to the trench 150 and another of the plurality of channel layers 131 may be removed.

The first extension portion 167 may include a first portion 167*a* including a surface that is exposed by the trench 150 and a second portion 167*b* that is positioned between the first portion 167*a* and the channel layer 131.

The width in the thickness direction of the first portion 167*a* may be smaller than the width in the thickness direction of the second portion 167*b*.

In addition, the shape of the fourth extension portion 169 may be different from the shape of the first extension portion 167.

The width in the thickness direction of the fourth extension portion 169 may be constant. For example, the width in the thickness direction of the fourth extension portion 169 may be equal to the width in the thickness direction of the second portion 167*b*.

The first extension portion 167 and the fourth extension portion 169 may be formed using an etch selectivity between the first gate electrode 121, the second gate electrode 122, the insulating layer 133, the etch stop pattern 143, and the first sacrificial layer 110.

For example, the forming of the first extension portion 167 may include selective etching of the etch stop pattern 143.

Further, the forming of the fourth extension portion 169 may include selective etching of the first sacrificial layer 110 and the etch stop pattern 143.

Figure 18:
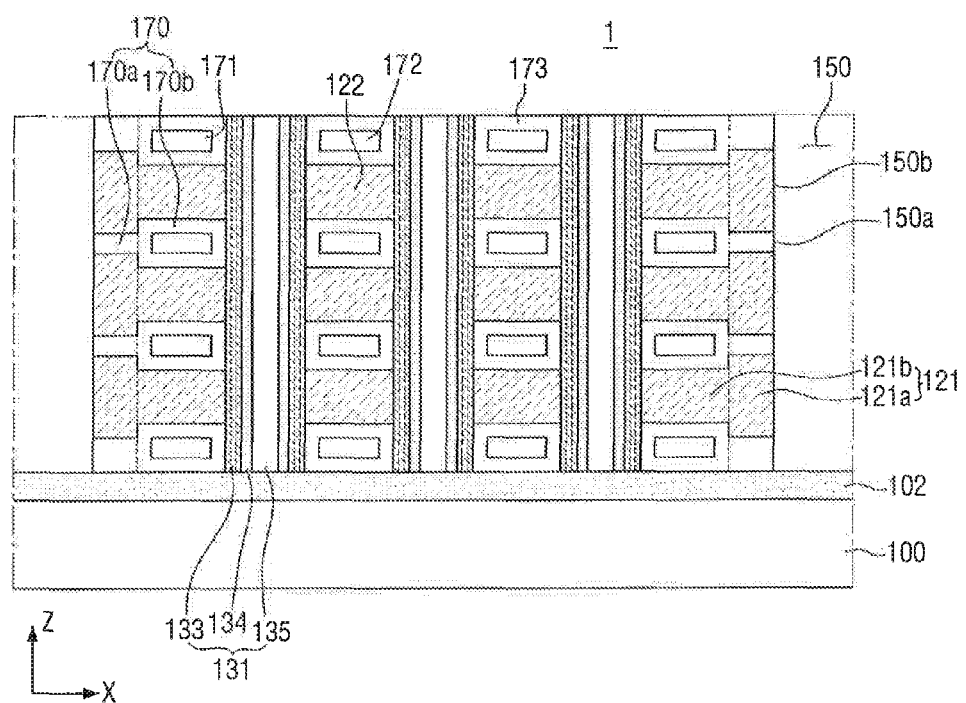

Referring to FIG. 18, a first interlayer insulating layer 170 that includes a first air gap 171 may be formed in the first extension portion 167.

The first interlayer insulating layer 170 may be formed on the first trench portion 150*a*. In other words, the first interlayer insulating layer 170 may be formed between the channel layer 131 that is adjacent to the trench 150 and the trench 150.

Further, a second interlayer insulating layer 173 that includes a second air gap 172 may also be formed in the fourth extension portion 169.

The first interlayer insulating layer 170 may include a first portion 170*a* that includes a surface that is exposed by the trench 150 and a second portion 170*b* that is positioned between the first portion 170*a* and the channel layer 131.

The thickness between the first gate electrodes 121 that are vertically adjacent to the first portion 170*a* may be smaller than the thickness between the first gate electrodes 121 that are vertically adjacent to the second portion 170*b*.

The thickness between the second gate electrodes 122 that are vertically adjacent to the second interlayer insulating layer 173 may be constant. For example, the thickness of the second interlayer insulating layer 173 may be equal to the thickness of the second portion 170*b* of the first interlayer insulating layer 170. In other words, the shape of the second interlayer insulating layer 173 may be different from the shape of the first interlayer insulating layer 170.

The first interlayer insulating layer 170 and the second interlayer insulating layer 173 may be formed, for example, using chemical vapor deposition (CVD) or atomic layer deposition (ALD).

The first interlayer insulating layer 170 may include the first air gaps 171 and the second interlayer insulating layer 173 may include the second air gaps 172.

FIG. 18 illustrates that the first air gap 171 that is included in the first interlayer insulating layer 170 is positioned on the second portion 170*b* of the first interlayer insulating layer 170, but the present inventive concept is not limited thereto.

For example, the first air gap 171 may be formed to overlap the first portion 170*a* and the second portion 170*b* of the first interlayer insulating layer 170.

The first air gap 171 that is included in the first interlayer insulating layer 170 may be formed in the process of forming the first interlayer insulating layer 170.

For example, when the first interlayer insulating layer 170 is formed, a material that forms the first interlayer insulating layer 170 fills in the first extension portion 167 through the first portion 167*a* of the first extension portion 167.

As described above, the thickness of the first portion 167*a* of the first extension portion 167 may be smaller than the thickness of the second portion 167*b* of the first extension portion 167.

Accordingly, in the process in which the material that forms the first interlayer insulating layer 170 is deposited in the first extension portion 167, the first portion 167*a* of the first extension portion 167 may be filled prior to the second portion 167*b*.

This way, the material that forms the first interlayer insulating layer 170 is unable to be deposited on the second portion 167*b*, thus an empty space, in other words, the first air gap 171, may occur.

According to the method for fabricating a nonvolatile memory device according to an exemplary embodiment of the present inventive concept, since a low-k material is included in the interlayer insulating layer that is arranged between word lines, a coupling phenomenon between the word lines can be reduced, and reliability of the nonvolatile memory device can be increased.

Further, since the coupling phenomenon between the word lines can be reduced due to the first air gap 171 and the second air gap 172, the thickness of the first interlayer insulating layer 170 and the second interlayer insulating layer 173 can be reduced. Accordingly, the method for fabricating a nonvolatile memory device according to an exemplary embodiment of the present inventive concept can increase density.

Figure 19:
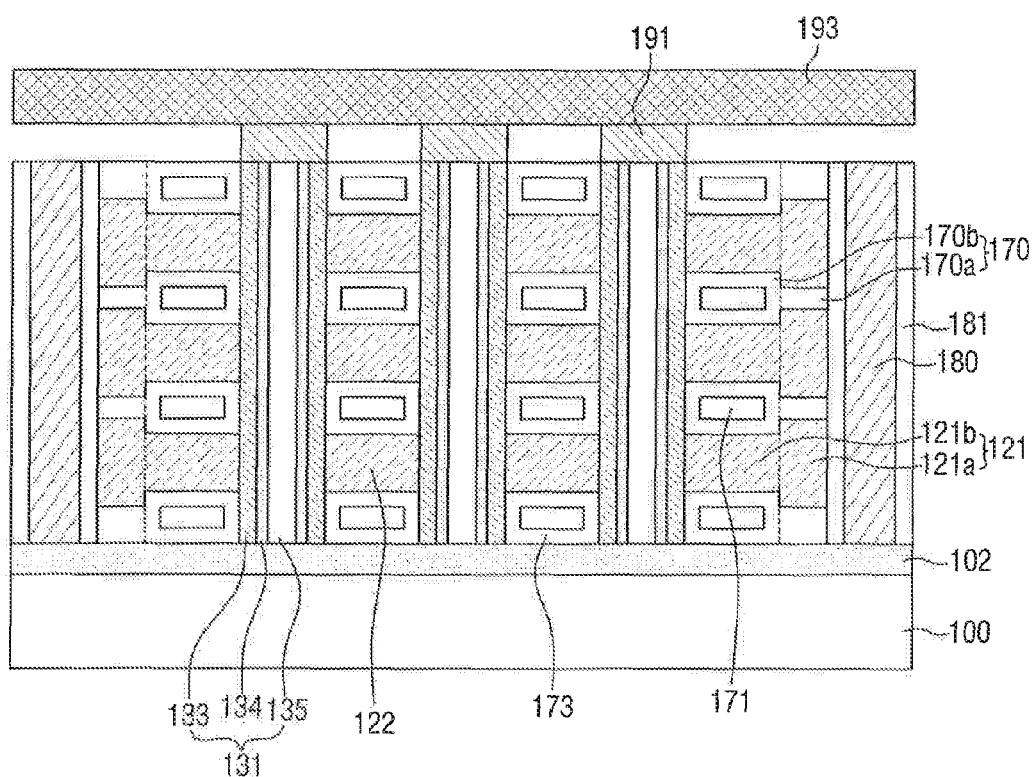

Referring to FIG. 19, a conductive line 180 that fills the trench 150 and comes in contact with the substrate 100 may be formed.

The conductive line 180 may be formed to fill the remaining space of the trench 150.

A spacer 181 may be conformally formed on a side wall of the conductive line 180. In other words, the spacer 181 may be conformally formed on the first portion 150*a* and the second portion 150*b* of the trench 150.

The spacer 181 may be formed, for example, using chemical vapor deposition (CVD) or atomic layer deposition (ALD).

A drain 191 may be formed on the channel layer 131.

A bit line 193 may extend in the first direction x on the drain 191.

The bit line 193 may be electrically connected to the drain 191, but the present inventive concept is not limited thereto. For example, the bit line 193 may be electrically connected through a contact plug.

Hereinafter, referring to FIGS. 4 to 13, 19, and 20 to 25, a method for fabricating a nonvolatile memory device according to an exemplary embodiment of the present inventive concept will be described.

FIGS. 20 to 25 are views of steps of a method for fabricating a nonvolatile memory device according to an exemplary embodiment of the present inventive concept. Hereinafter, for briefness, differences from the points described above will be mainly described.

Figure 20:
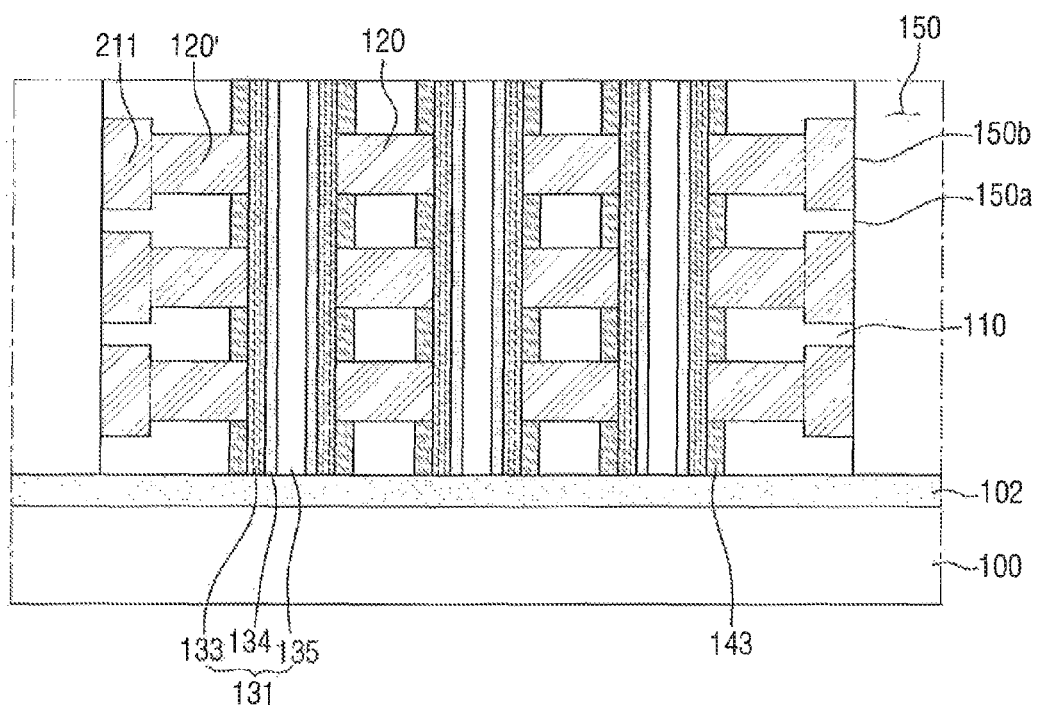

FIG. 20 is a cross-sectional view of a nonvolatile memory device according to an exemplary embodiment of the present inventive concept after the processes as illustrated in FIGS. 4 to 13 are performed.

Referring to FIG. 20, after the third recess 161 (in FIG. 13) is formed, a capping pattern 211 that fills the third recess 161 (in FIG. 13) may be formed.

The capping pattern 211 may be formed between the channel layer 131 that is adjacent to the trench 150 and the trench 150. For example, the capping pattern 211 may be formed on the second portion 150b of the trench 150.

The uneven side wall of the trench 150 after the forming of the third recess 161 (in FIG. 13) may become even again after the capping pattern 211 is formed.

The thickness between the first sacrificial layers 110 that are vertically adjacent to the capping pattern 211 may be larger than the thickness between the first sacrificial layers 110 that are vertically adjacent to the remaining second sacrificial layer 120'.

The capping pattern 211 may include the same material as the second sacrificial layer 120.

The capping pattern 211 may include a silicon nitride layer, but the present inventive concept is not limited thereto. For example, the capping pattern 211 may include silicon oxide layers having an etch rate that is different from the etch rate of the first sacrificial layer 110.

The capping pattern 211 may be formed, for example, using chemical vapor deposition (CVD) or atomic layer deposition (ALD).

Figure 21:
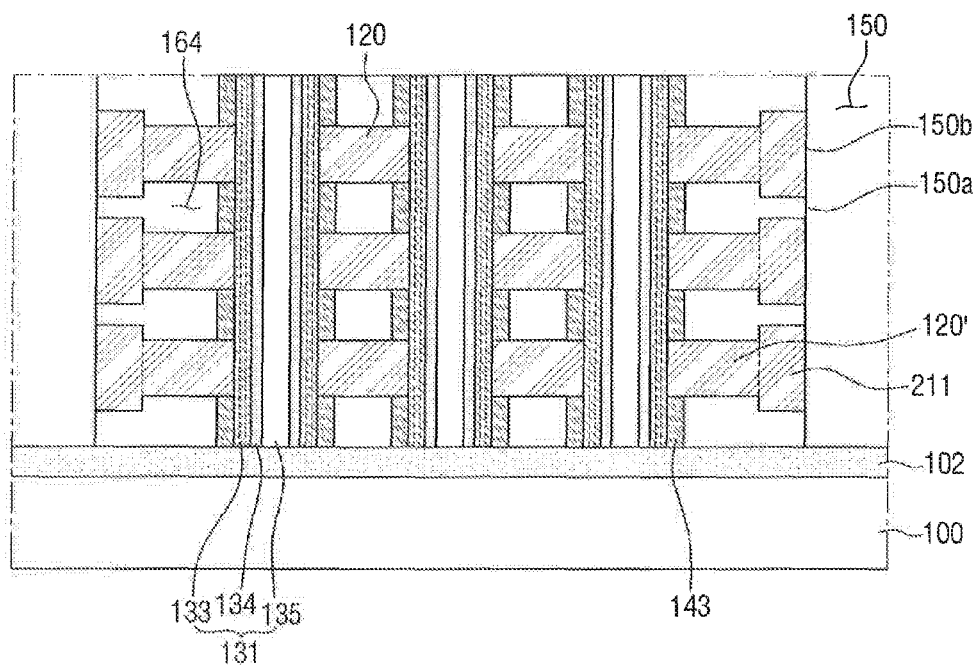

Referring to FIG. 21, after the capping pattern 211 is formed, an empty space 164 may be formed through removal of the first sacrificial layer 110 that is exposed through the trench 150.

The empty space 164 may be formed, for example, through a wet etching process. An etchant used in the wet etching process may be, for example, hydrofluoric acid (HF), but the present inventive concept is not limited thereto.

For example, the empty space 164 may be formed using an etch selectivity between the first sacrificial layer 110, the remaining second sacrificial layer 120', the capping pattern 211, and the etch stop pattern 143. In other words, the forming of the empty space 164 may include selective etching of the first sacrificial layer 110 that is exposed through the trench 150.

Figure 22:
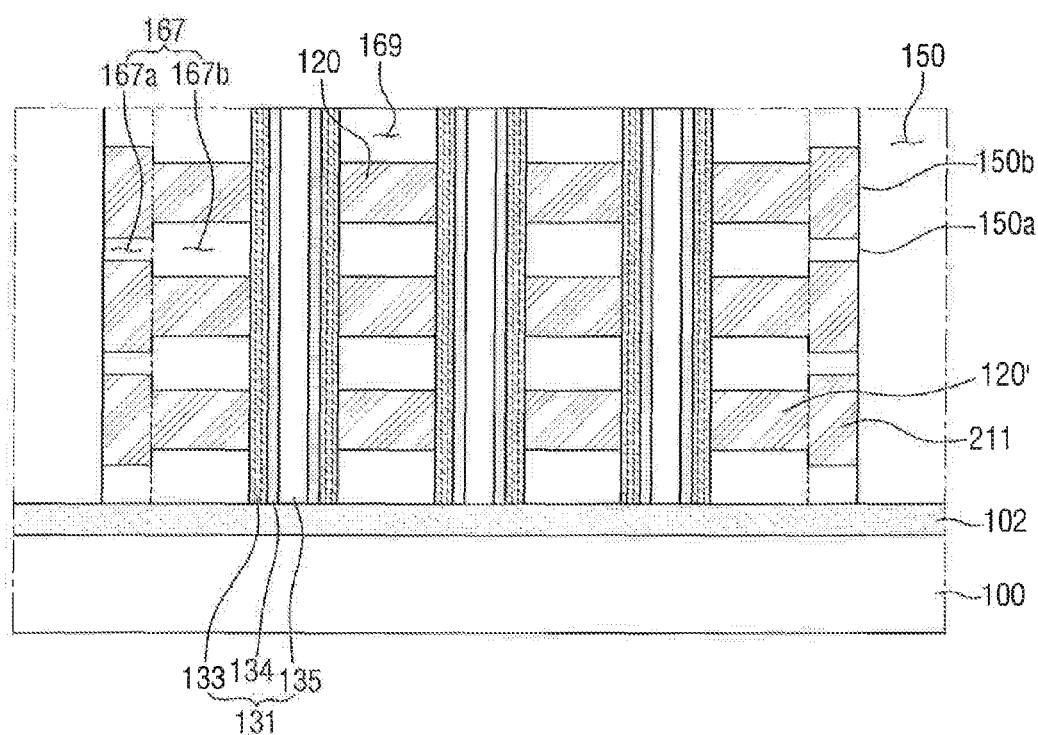

Referring to FIG. 22, after the empty space 164 is formed, a first extension portion 167 may be formed through removal of the etch stop pattern 143. Further, a fourth extension portion 169 may be formed between the channel layer 131 that is adjacent to the trench 150 and another of the plurality of channel layers 131.

The first extension portion 167 and the fourth extension portion 169 may be formed using an etch selectivity between the remaining second sacrificial layer 120', the capping pattern 211, the insulating layer 133, the etch stop pattern 143, and the first sacrificial layer 110.

Figure 23:
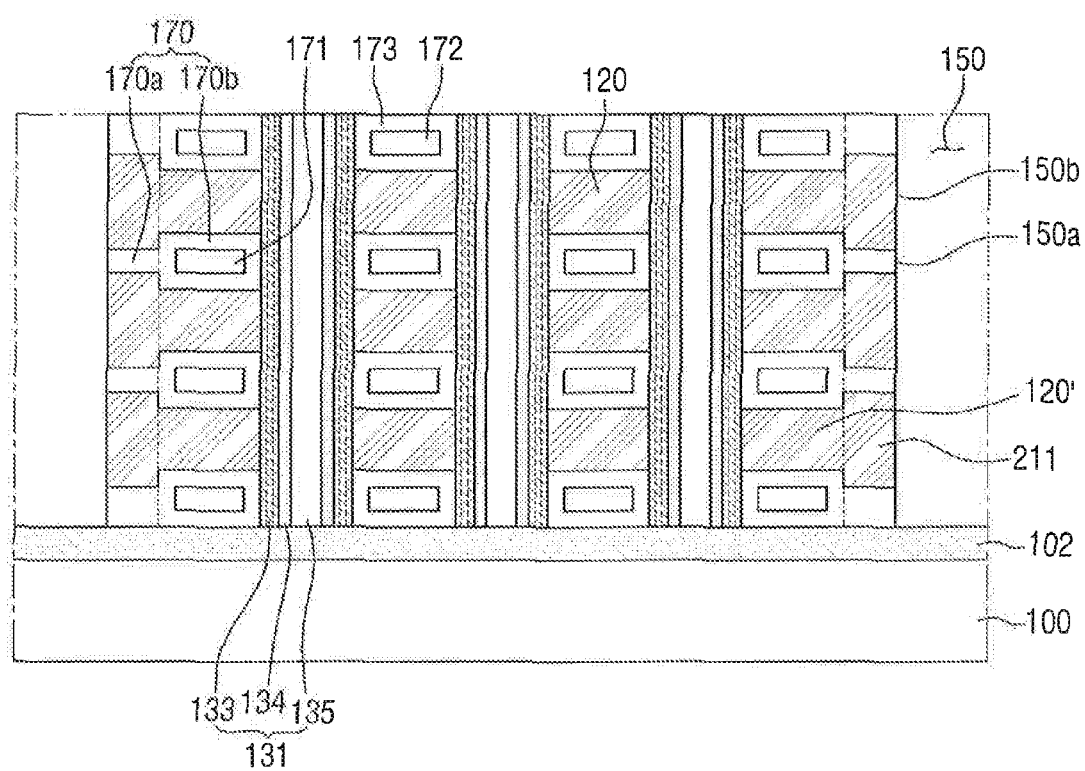

Referring to FIG. 23, a first interlayer insulating layer 170 that includes a first air gap 171 may be formed in the first extension portion 167 of FIG. 22. Further, a second interlayer insulating layer 173 that includes a second air gap 172 may also be formed in the fourth extension portion 169 of FIG. 22.

The first air gap 171 may be formed between the remaining second sacrificial layers 120' that are vertically adjacent to the substrate 100.

Figure 24:
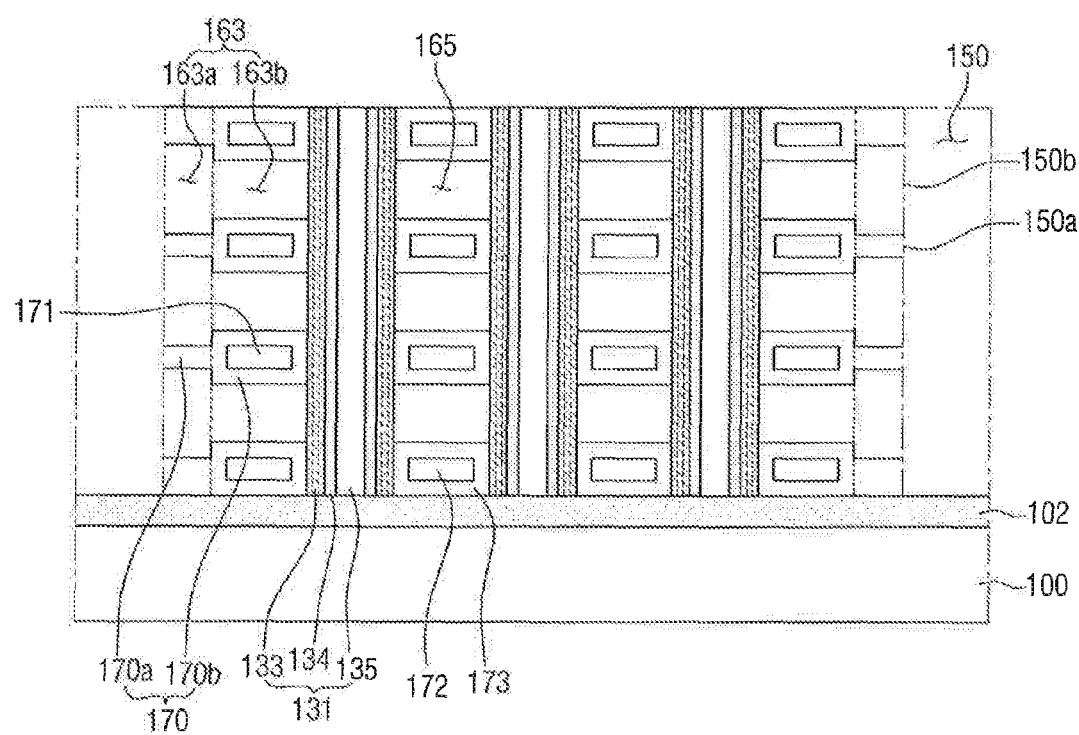

Referring to FIG. 24, a second extension portion 163 may be formed through removal of the remaining second sacrificial layer 120' and the capping pattern 211.

Further, a third extension portion 165 may also be formed between the channel layer 131 that is adjacent to the trench 150 and another of the plurality of channel layers 131. In other words, the second sacrificial layer 120 between the channel layer 131 that is adjacent to the trench 150 and another of the plurality of channel layers 131 may be removed.

Removal of the remaining second sacrificial layer 120' and the capping pattern 211 may be performed using an etch selectivity between the first sacrificial layer 110, the insulating layer 133, the etch stop pattern 143, the remaining second sacrificial layer 120', and the capping pattern 211.

Figure 25:
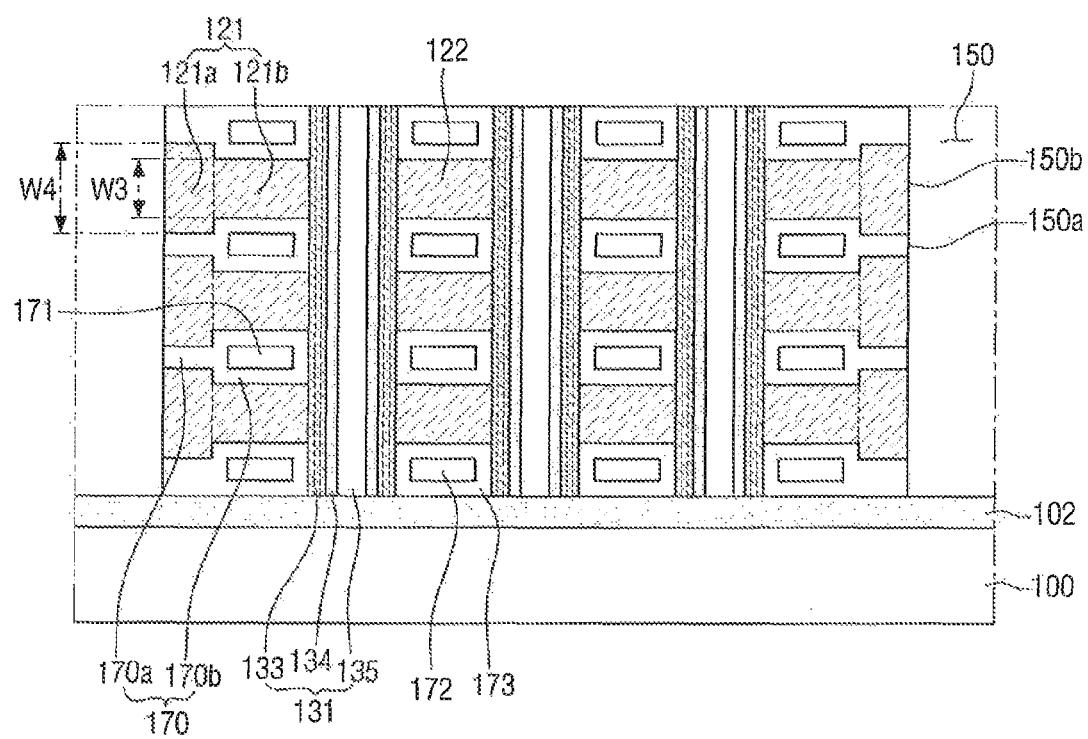

Referring to FIG. 25, a first gate electrode 121 that fills the second extension portion 163 may be formed.

In this case, a second gate electrode 122 that fills the third extension portion 165 may also be formed.

Referring again to FIG. 19, as described above, the conductive line 180 that fills the trench 150 and comes in contact with the substrate 100 may be formed.

Further, the drain 191 and the bit line 193 may be formed.

Figure 26:
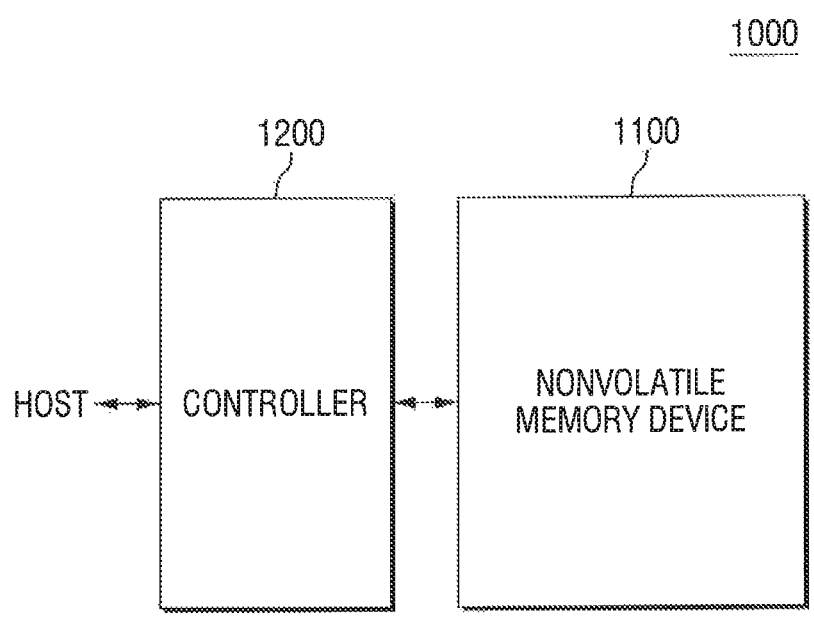
FIG. 26 is a block diagram of a memory system according to an exemplary embodiment of the present inventive concept.

FIG. 26 is a block diagram of a memory system according to an exemplary embodiment of the present inventive concept.

Referring to FIG. 26, a memory system 1000 includes a nonvolatile memory device 1100 and a controller 1200.

The nonvolatile memory device 1100 may be configured and operate in the same or similar manner as that as described above with reference to FIGS. 1 to 25.

The controller 1200 is connected to a host and the nonvolatile memory device 1100. The controller 1200 is configured to access the nonvolatile memory device 1100 in response to a request from the host. For example, the controller 1200 is configured to control read, write, erase, and background operations of the nonvolatile memory device 1100. The controller 1200 is configured to provide an interface between the nonvolatile memory device 1100 and the host. The controller 1200 is configured to operate firmware for controlling the nonvolatile memory device 1100.

For example, the controller 1200 includes constituent elements, such as a Random Access Memory (RAM), a processing unit, a host interface, and a memory interface. The RAM is used as at least one of an operating memory of the processing unit, a cache memory between the nonvolatile memory device 1100 and the host, and a buffer memory between the nonvolatile memory device 1100 and the host. The processing unit controls the overall operation of the controller 1200.

The host interface includes a protocol for performing data exchange between the host and the controller 1200. For example, the controller 1200 is configured to communicate with an outside (host) through at least one of various interface protocols, such as a Universal Serial Bus (USB) protocol, a Multimedia Card (MMC) protocol, a Peripheral Component Interconnection (PCI) protocol, a PCI-Express (PCI_E) protocol, an Advanced Technology Attachment (ATA) protocol, a Serial-ATA protocol, a Parallel-ATA protocol, a Small Computer Small Interface (SCSI) protocol, an Enhanced Small Disk Interface (ESDI) protocol, and an Integrated Drive Electronics (IDE) protocol. The memory interface performs interfacing with the nonvolatile memory device 1100. For example, the memory interface includes a NAND interface or a NOR interface.

The memory system 1000 may be configured to additionally include an error correction block. The error correction block is configured to detect and correct an error of data that is read from the nonvolatile memory device using an Error Correction Code (ECC). For example, the error correction block is provided as a constituent element of the controller 1200. The error correction block may be provided as a constituent element of the nonvolatile memory device 1100.

The controller 1200 and the nonvolatile memory device 1100 may be integrated into one semiconductor device. For example, the controller 1200 and the nonvolatile memory device 1100 may be integrated into one semiconductor device to configure a memory card. For example, the controller 1200 and the nonvolatile memory device 1100 may be integrated into one semiconductor device to configure a memory card, such as a PC card (e.g., a Personal Computer Memory Card International Association (PCMCIA) card), a compact flash (CF) card, a smart media card (e.g., SM or SMC), a memory stick, a multimedia card (e.g., MMC, reduced size (RS) (RS-MMC), or MMCmicro), a secure digital (SD) card (e.g., SD, miniSD, microSD, or SD High Capacity (SDHC)), or a universal flash storage (UFS) device.

The controller 1200 and the nonvolatile memory device 1100 may be integrated into one semiconductor device to configure a Solid State Drive (SSD). The SSD includes a storage device configured to store data in a semiconductor memory. In the case where the memory system 1000 is used as the SSD, the operating speed of the host that is connected to the memory system 1000 can be increased.

As another example, the memory system 1000 may be provided as one of various constituent elements of electronic devices, such as a computer, an Ultra Mobile Personal Computer (UMPC), a work station, a net-book, a Personal Digital Assistant (PDA), a portable computer, a web tablet, a wireless phone, a mobile phone, a smart phone, an e-book, a Portable Multimedia Player (PMP), a portable game machine, a navigation device, a black box, a digital camera, a 3-dimensional television receiver, a digital audio recorder, a digital audio player, a digital picture recorder, a digital picture player, a digital video recorder, a digital video player, a device that can transmit and receive information in a wireless environment, one of various electronic devices constituting a home network, one of various electronic devices constituting a computer network, one of various electronic devices constituting a telematics network, a Radio Frequency Identification (RFID) device, or one of various constituent elements constituting a computing system.

For example, the nonvolatile memory device 1100 or the memory system 1000 may be mounted as various types of packages. For example, the nonvolatile memory device 1100 or the memory system 1000 may be packaged and mounted as Package on Package (PoP), Ball grid arrays (BGAs), Chip Scale Packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (PMQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), Wafer-Level Processed Stack Package (WSP), or the like.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims.

What is claimed is:

1. A nonvolatile memory device, comprising:
 a conductive line disposed on a substrate and vertically extended from the substrate;
 a first channel layer disposed on the substrate and vertically extended from the substrate, wherein the first channel layer is spaced apart from the conductive line;
 a second channel layer vertically extended from the substrate, wherein the second channel layer is disposed between the first channel layer and the conductive line;
 a first gate electrode disposed between the conductive line and the second channel layer, wherein the first gate electrode includes a first portion having a first thickness and a second portion having a second thickness that is different from the first thickness; and
 a second gate electrode disposed between the first channel layer and the second channel layer, wherein the second gate electrode has the second thickness,
 wherein the second portion of the first gate electrode is disposed between first and second air gaps, and the first portion of the first gate electrode is not disposed between the first and second air gaps.

2. The nonvolatile memory device of claim 1, wherein the nonvolatile memory device comprises a three-dimensional (3D) memory array.

3. The nonvolatile memory device of claim 2, wherein the 3D memory array comprises a plurality of memory cells, and each of the plurality of memory cells comprises a charge trap layer.

4. The nonvolatile memory device of claim 2, wherein the 3D memory array comprises a plurality of memory strings that are vertically arranged with respect to the substrate.

5. The nonvolatile memory device of claim 1, wherein the first portion of the first gate electrode is closer to the conductive line than the second portion of the first gate electrode.

6. The nonvolatile memory device of claim 5, wherein the first thickness is larger than the second thickness.

7. The nonvolatile memory device of claim 1, further comprising:
 a third gate electrode disposed between the conductive line and the second channel layer;
 the first air gap is disposed between the third gate electrode and the first gate electrode;
 a fourth gate electrode disposed between the first channel layer and the second channel layer; and
 a third air gap disposed between the fourth gate electrode and the second gate electrode.

8. The nonvolatile memory device of claim 7, wherein the third gate electrode comprises a third portion that corresponds to the first portion of the first gate electrode and a fourth portion that corresponds to the second portion of the first gate electrode, and
 the first air gap is disposed between the second portion of the first gate electrode and the fourth portion of the third gate electrode.

9. A method for fabricating a nonvolatile memory device, comprising:
 forming a mold layer on a substrate, wherein the mold layer comprises first and second sacrificial layers that are alternately laminated;

forming a channel hole in the mold layer to expose the substrate;

forming an etch stop pattern on the first sacrificial layer that is exposed by the channel hole;

forming a channel layer in the channel hole in which the etch stop pattern is formed;

forming a trench in the mold layer, wherein the trench is spaced apart from the channel layer and exposes the substrate;

forming a first extension portion by removing the first sacrificial layer and the etch stop pattern after forming the trench; and forming an interlayer insulating layer that includes an air gap in the first extension portion, wherein the forming of the etch stop pattern comprises:

forming a first recess by removing a part of the first sacrificial layer that is exposed by the channel hole;

forming an etch stop layer which fills the first recess along a side wall of the channel hole; and removing the etch stop layer that is formed on the second sacrificial layer.

10. The method of claim 9, further comprising:

after forming the trench and before forming the first extension portion, forming a second recess by removing a part of the second sacrificial layer that is exposed by the trench; and forming a third recess by increasing a width of the second recess.

11. The method of claim 10, further comprising:

forming a second extension portion by removing the second sacrificial layer remaining between the channel layer and the trench after forming the third recess; and forming a gate electrode that fills the second extension portion.

12. The method of claim 11, wherein the gate electrode comprises a first portion and a second portion, the first portion of the gate electrode comprises an exposure surface that is exposed by the trench, and the second portion of the gate electrode is disposed between the first portion of the gate electrode and the channel layer, and a thickness of the first portion of the gate electrode is larger than a thickness of the second portion of the gate electrode.

13. The method of claim 11, wherein the air gap is formed between the gate electrode and another gate electrode that are vertically adjacent to each other.

14. The method of claim 10, further comprising forming a capping pattern that fills the third recess after forming the third recess, wherein the capping pattern and the second sacrificial layer comprise the same material.

15. A nonvolatile memory device, comprising:

a conductive line extended from a substrate in a first direction;

a first channel layer extended from the substrate in the first direction;

a second channel layer extended from the substrate in the first direction, wherein the second channel layer is disposed between the first channel layer and the conductive line;

a first gate electrode disposed between the conductive line and the second channel layer; and a second gate electrode disposed between the first channel layer and the second channel layer, wherein the second gate electrode has a different shape than the first gate electrode, wherein a second portion of the first gate electrode is disposed between first and second air gaps, and a first portion of the first gate electrode is only disposed between first and second interlayer insulating layers.

16. The nonvolatile memory device of claim 15, wherein the first gate electrode includes the first portion adjacent to the conductive line and the second portion adjacent to the second channel layer, wherein a width of the first portion is greater than a width of the second portion.

17. The nonvolatile memory device of claim 16, wherein a width of the second gate electrode is the same as the width of the second portion of the first gate electrode.

18. The nonvolatile memory device of claim 15, further comprising:

a third gate electrode extended from the substrate in the first direction; and the first air gap is disposed between the first gate electrode and the third gate electrode.

19. The nonvolatile memory device of claim 18, wherein the third gate electrode has the same shape as the first gate electrode.

20. The nonvolatile memory device of claim 16, wherein the first interlayer insulating layer disposed adjacent to the first portion of the first gate electrode is extended to the second portion of the first gate electrode and surrounds the first air gap.

* * * * *